(12) United States Patent
Husain et al.

(10) Patent No.: US 12,381,518 B2
(45) Date of Patent: Aug. 5, 2025

(54) LOW-NOISE AMPLIFIER (LNA) INPUT IMPEDANCE ADJUSTMENT CIRCUIT

(71) Applicant: QUALCOMM Incorporated, San Diego, CA (US)

(72) Inventors: Amjath Husain, Bangalore (IN); Girish Koppassery, Bangalore (IN); Madhukar Vallabhaneni, Bengaluru (IN)

(73) Assignee: QUALCOMM Incorporated, San Diego, CA (US)

( * ) Notice: Subject to any disclaimer, the term of this patent is extended or adjusted under 35 U.S.C. 154(b) by 490 days.

(21) Appl. No.: 17/971,490

(22) Filed: Oct. 21, 2022

(65) Prior Publication Data
US 2023/0126116 A1    Apr. 27, 2023

Related U.S. Application Data

(60) Provisional application No. 63/263,124, filed on Oct. 27, 2021.

(51) Int. Cl.
*H03F 1/22* (2006.01)
*H03F 1/56* (2006.01)
*H03F 3/193* (2006.01)
*H04B 1/18* (2006.01)

(52) U.S. Cl.
CPC ............ *H03F 1/565* (2013.01); *H03F 3/193* (2013.01); *H04B 1/18* (2013.01); *H03F 2200/294* (2013.01); *H03F 2200/372* (2013.01); *H03F 2200/451* (2013.01)

(58) Field of Classification Search
CPC ........................................................ H03F 1/22
USPC .................................................. 330/311, 310
See application file for complete search history.

(56) References Cited

U.S. PATENT DOCUMENTS

2017/0163215 A1   6/2017   Gorbachov et al.
2017/0237402 A1   8/2017   Kim et al.

OTHER PUBLICATIONS

Cassan D.J., et al., "A 1-V Transformer-Feedback Low-Noise Amplifier for 5-GHz Wireless LAN in 0.18-μm CMOS", IEEE Journal of Solid-State Circuits, vol. 38, No. 3, DOI: 10.1109/JSSC.2002.808284, Mar. 2003, pp. 427-435.
Mineyama A., et al., "A Millimeter-Wave CMOS Low Noise Amplifier using Transformer Neutralization Techniques", Asia-Pacific Microwave Conference 2011, 2011, pp. 223-226.
Gangopadhyay D., et al., "A 1.6 mW 5.4 GHz Transformer-Feedback gm-Boosted Current-Reuse LNA in 0.18μm CMOS", IEEE International Symposium on Circuits and Systems, ISCAS 2010—May 30-Jun. 2, 2010—Paris, France, IEEE, US, May 30, 2010, pp. 1635-1638, XP031724700, p. 1635, left-hand column, line 14-p. 1638, right-hand column, line 5, figures 1-8.
International Search Report and Written Opinion—PCT/US2022/047598—ISA/EPO—Feb. 13, 2023.

(Continued)

*Primary Examiner* — Henry Choe
(74) *Attorney, Agent, or Firm* — Loza & Loza LP

(57) ABSTRACT

Aspects of the present disclosure provide a circuit configured to adjust an input impedance of an amplifier such as a low-noise amplifier. In certain aspects, the circuit is coupled to a node, wherein the node is between a first transistor and a second transistor of the amplifier. The circuit may include an inductor and a capacitor coupled in series, wherein the inductor is coupled with one or more load inductors of the amplifier through negative magnetic coupling.

21 Claims, 18 Drawing Sheets

(56) References Cited

OTHER PUBLICATIONS

Plessas F., et al., "A 5 GHZ Low Noise Amplifier on 0.35 μm BiCMOS SiGe", Electronics, Circuits and Systems, ICECS 2003, Proceedings of the 2003 10th IEEE International Conference on, [Online], Jan. 1, 2003, pp. 1082-1085, XP093018430, Piscataway, NJ, USA, p. 1082, left-hand column, line 2-p. 1085, right-hand column, line 18, figures 1-10.
Toofan S., et al., "Low Power and High Gain Current Reuse LNA with Modified Input Matching and Inter-Stage Inductors", Microelectronics Journal, Mackintosh Publications LTD, Luton, GB, vol. 39, No. 12, Dec. 1, 2008, pp. 1534-1537, XP025678410, p. 1534, left-hand column, line 2-p. 1537, left-hand column, line 8, figures1-6.

LOW-NOISE AMPLIFIER (LNA) INPUT IMPEDANCE ADJUSTMENT CIRCUIT

RELATED APPLICATION

This application claims priority to and the benefit of Provisional Patent Application No. 63/263,124, filed on Oct. 27, 2021, the entire specification of which is incorporated herein by reference.

FIELD

Aspects of the present disclosure relate generally to wireless communications, and, more particularly, to low-noise amplifiers.

BACKGROUND

A wireless device (e.g., smart phone) may transmit and receive radio frequency (RF) signals in one or more wireless networks (e.g., long-term evolution (LTE) network, fifth generation (5G) network, wireless local area network (WLAN), etc.). To receive RF signals, the wireless device includes one or more antennas and one or more low-noise amplifiers (LNAs) configured to amplify RF signals received by the one or more antennas.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to an apparatus including an amplifier. The amplifier includes a first transistor having a gate, a source, and a drain, wherein the gate of the first transistor is coupled to an input of the amplifier, and the source of the first transistor is coupled to a ground. The amplifier also includes a second transistor having a gate, a source, and a drain, wherein the gate of the second transistor is configured to receive a bias voltage, and the source of the second transistor is coupled to the drain of the first transistor. The amplifier further includes a first inductor coupled between the drain of the second transistor and a supply rail, and a circuit coupled to a node, wherein the node is between the first transistor and the second transistor. The circuit includes a second inductor, wherein the second inductor is coupled with the first inductor through negative magnetic coupling, and a capacitor coupled in series with the second inductor.

A second aspect relates to an apparatus including an amplifier. The amplifier includes a first transistor having a gate, a source, and a drain, wherein the gate of the first transistor is coupled to an input of the amplifier, and the source of the first transistor is coupled to a ground. The amplifier also includes a second transistor having a gate, a source, and a drain, wherein the gate of the second transistor is configured to receive a bias voltage, and the source of the second transistor is coupled to the drain of the first transistor. The amplifier further includes a first inductor and a second inductor coupled in series between the drain of the second transistor and a supply rail, and a circuit coupled to a node, wherein the node is between the first transistor and the second transistor. The circuit includes a third inductor, wherein the third inductor is coupled with the first inductor through negative magnetic coupling, and a capacitor coupled in series with the third inductor.

A third aspect relates to a method of operating an amplifier. The amplifier includes a first transistor, a second transistor, and a first inductor, wherein a gate of the first transistor is coupled to an input of the amplifier, the gate of the second transistor is biased by a bias voltage, a source of the second transistor is coupled to a drain of the first transistor, and the first inductor is coupled to a drain of the second transistor. The method includes generating a first current that flows in an opposite direction with respect to a node as a second current flowing through the first inductor, wherein the node is between the source of the second transistor and the drain of the second transistor, and providing the first current to the node.

A fourth aspect relates to an apparatus. The apparatus includes an amplifier. The amplifier includes a transconductance device coupled to an input of the amplifier, a current buffer coupled to the transconductance device, and a first inductor coupled between the current buffer and a supply rail. The amplifier also includes a circuit coupled to a node, wherein the node is between the transconductance device and the current buffer. The circuit includes a second inductor, wherein the second inductor is coupled with the first inductor through negative magnetic coupling, and a capacitor coupled in series with the second inductor.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
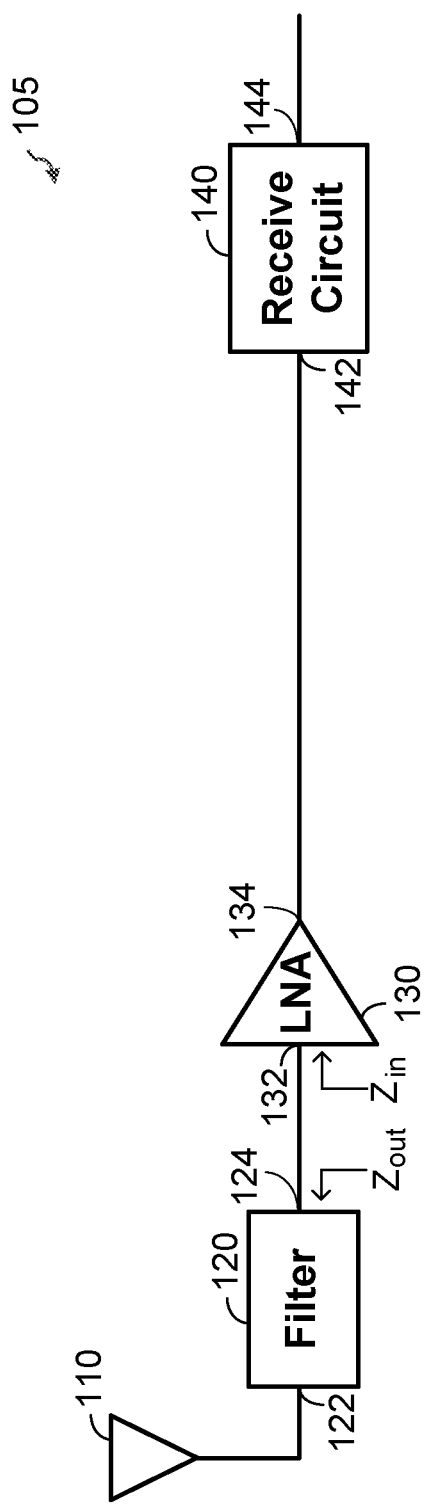
FIG. 1 shows an example of a receiver including a filter and a low-noise amplifier (LNA) according to certain aspects of the present disclosure.

A receiver of a wireless device may include one or more low-noise amplifiers (LNAs) configured to amplify radio frequency (RF) signals received by one or more antennas. In this regard, FIG. 1 shows an example of a receiver 105 including an LNA 130 according to certain aspects. In this example, the receiver 105 also includes an antenna 110, a filter 120 (also referred to as a filter circuit), and a receive circuit 140 (also referred to as a receive chain). The receiver 105 may be incorporated in a wireless device (e.g., a mobile wireless device, an access point, etc.). Although one antenna 110, one filter 120, and one LNA 130 are shown in FIG. 1, it is to be appreciated that the wireless device may include multiple antennas (e.g., arranged in an array), multiple filters, and/or multiple LNAs.

In the example in FIG. 1, the filter 120 has an input 122 coupled to the antenna 110, and an output 124. The LNA 130 has an input 132 coupled to the output 124 of the filter 120, and an output 134. The receive circuit 140 has an input 142 coupled to the output 134 of the LNA 130, and an output 144. The output 144 of the receive circuit 140 may be coupled to a baseband processor, an intermediate frequency (IF) circuit, or another type of circuit.

In one example, the filter 120 is a bandpass filter configured to pass an RF signal received from the antenna 110 within a desired frequency band (i.e., pass band) while filtering out signals (e.g., interfering signals) outside the desired frequency band. The LNA 130 is configured to receive the RF signal at the input 132, amplify the RF signal, and output the amplified RF signal at the output 134.

The receive circuit 140 is configured to receive the RF signal at the input 142, convert the RF signal into a baseband signal or an intermediate frequency (IF) signal, and output the baseband signal or the IF signal at the output 144. For example, the receive circuit 140 may include a mixer (not shown) configured to mix the RF signal with a local oscillator signal to frequency downconvert the RF signal to obtain the baseband signal or the IF signal. The receive circuit 140 may also include one or more amplifiers (e.g., such as one or more further LNAs), one or more filters, a phase shifter, or any combination thereof.

For the example where the receive circuit 140 outputs a baseband signal, the output 144 may be coupled to a baseband processor (not shown). In this example, the baseband processor may decode and/or demodulate the baseband signal to recover data bits and/or control bits from the baseband signal.

For the example where the receive circuit 140 outputs an IF signal, the output 144 may be coupled to an IF circuit (not shown). In this example, the IF circuit may frequency downconvert the IF signal to obtain a baseband signal and output the baseband signal to a baseband processor.

Figure 2:
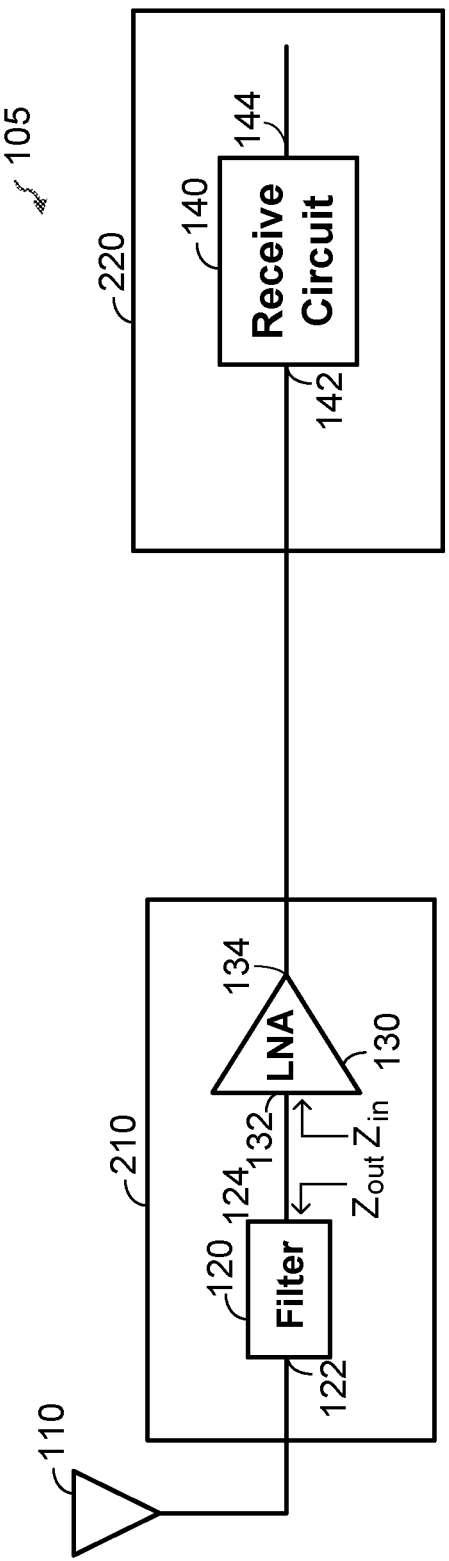
FIG. 2 shows an example in which the filter and the LNA are included on a front-end module coupled to an antenna according to certain aspects of the present disclosure.

FIG. 2 shows an example in which the filter 120 and the LNA 130 are included on an RF front-end module 210 located close to the antenna 110 to reduce signal losses between the antenna 110 and the RF front-end module 210. In this example, the receive circuit 140 is integrated on a chip 220 coupled to the RF front-end module 210 via one or more metal traces, a transmission line, a cable, etc. In one example, the RF front-end module 210 and the chip 220 may be mounted on a board (e.g., a printed circuit board). The filter 120 and the LNA 130 may be integrated on the same chip or may be integrated on separate chips. In some implementations, the LNA 130 and the receive circuit 140 may be integrated on the same chip (i.e., die).

The noise figure of the LNA 130 affects the overall noise performance of the receiver 105. Thus, it is desirable for the LNA 130 to have a low noise figure to achieve good noise performance for the receiver 105. The input impedance (labeled "$Z_{in}$") of the LNA 130 is an important parameter affecting the noise figure of the LNA 130. Accordingly, it is desirable to set the input impedance $Z_{in}$ of the LNA 130 to a value that achieves a low noise figure.

Figure 3:
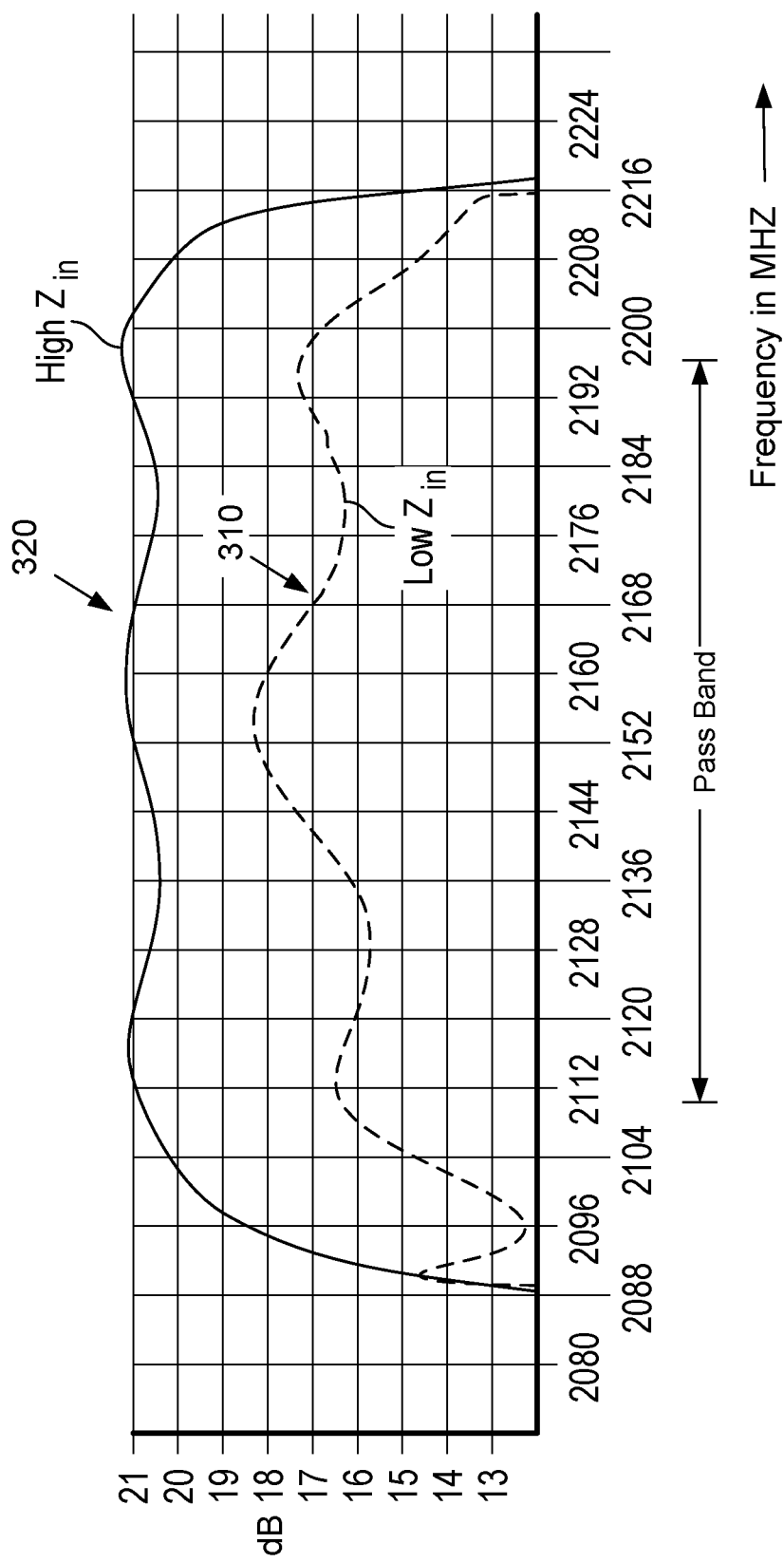
FIG. 3 shows exemplary frequency responses of a filter for different impedance matching conditions according to certain aspects of the present disclosure.

For the example where the input 132 of the LNA 130 is coupled to the filter 120, impedance matching between the input impedance $Z_{in}$ of the LNA 130 and the output impedance (labeled "$Z_{out}$") of the filter 120 affects the performance of the filter 120. In this regard, FIG. 3 shows an exemplary frequency response 310 of the filter 120 for the case where the input impedance of the LNA 130 is low (labeled "Low $Z_{in}$"), and an exemplary frequency response 320 of the filter 120 for the case where the input impedance of the LNA 130 is high (labeled "High $Z_{in}$"). In the example in FIG. 3, the low input impedance is approximately 18 ohms and the high input impedance is approximately 36 ohms. In this example, the low input impedance provides poor impedance matching with the output impedance $Z_{out}$ of the filter 120, and the high input impedance provides good impedance matching with the output impedance $Z_{out}$ of the filter 120.

As shown in FIG. 3, the frequency response 310 of the filter 120 for the case of poor impedance matching has much larger in-band ripples compared with the frequency response 320 of the filter 120 for the case of good impedance matching, in which an "in-band ripple" is a ripple within the pass band of the filter 120 indicated in FIG. 3. Thus, poor impedance matching between the input impedance $Z_{in}$ of the LNA 130 and the output impedance $Z_{out}$ of the filter 120 can significantly degrade the performance of the filter 120. Impedance matching techniques using off-chip elements may address this issue, but the off-chip elements may increase the form factor and cost. Accordingly, it is desirable to set the input impedance $Z_{in}$ of the LNA 130 to a value that provides good impedance matching with the output impedance $Z_{out}$ of the filter 120.

Thus, it is desirable to set the input impedance $Z_{in}$ of the LNA 130 to a value that achieves a low noise figure and/or impedance matching with the output impedance $Z_{out}$ of the filter 120. In this regard, aspects of the present disclosure provide an input impedance adjustment circuit for setting the input impedance $Z_{in}$ of the LNA 130, as discussed further below.

Figure 4:
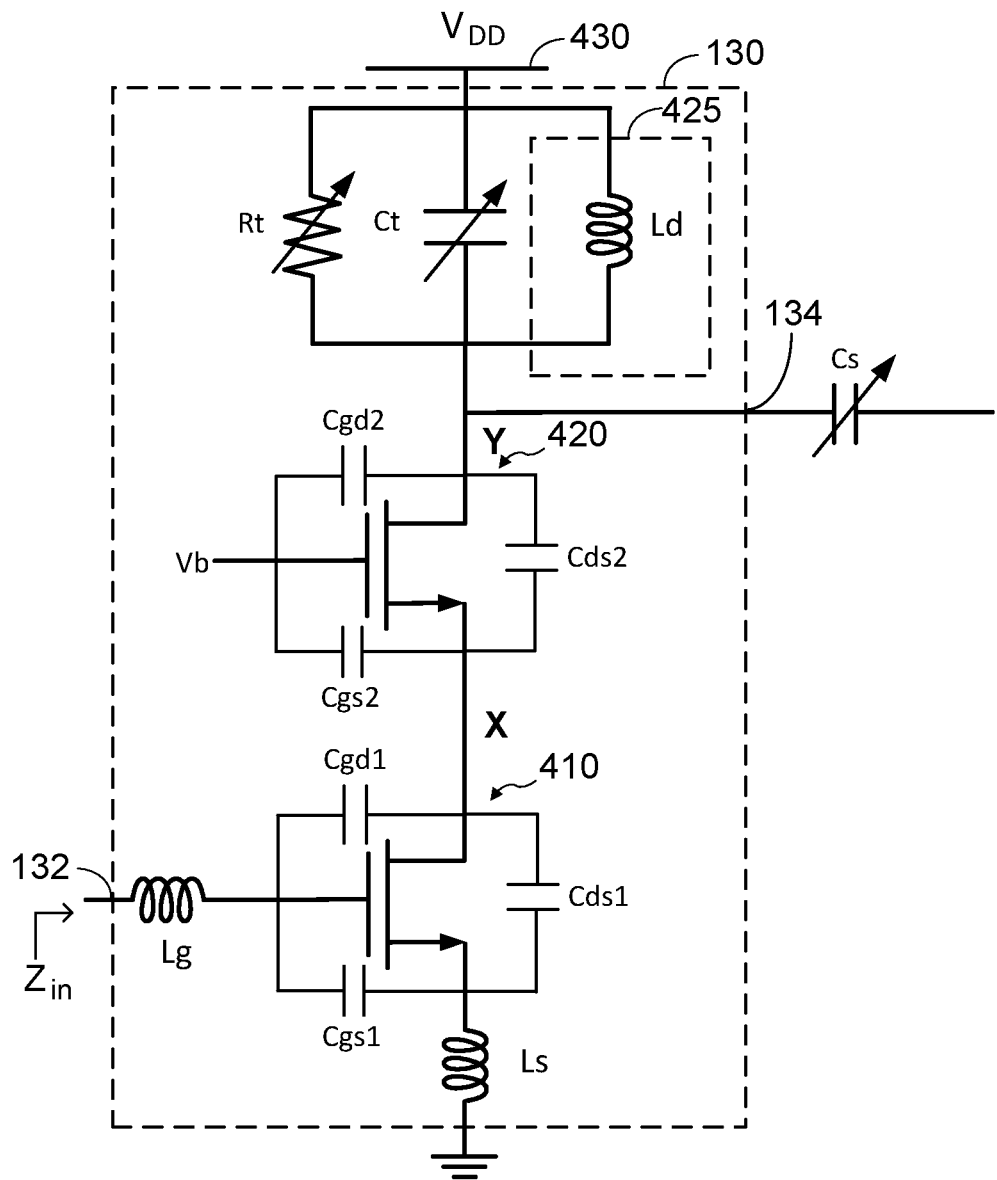
FIG. 4 shows an exemplary implementation of an LNA according to certain aspects of the present disclosure.

FIG. 4 shows an exemplary implementation of the LNA 130 according to certain aspects. In this example, the LNA 130 includes a first transistor 410, a second transistor 420, a source inductor Ls, a gate inductor Lg, and an inductor circuit 425. In the example in FIG. 4, the first transistor 410 is implemented with a first n-type field effect transistor (NFET) and the second transistor 420 is implemented with a second NFET. However, it is to be appreciated that the first transistor 410 and the second transistor 420 may be implemented with other types of transistors.

In the example in FIG. 4, the source inductor Ls is coupled between the source of the first transistor 410 and a ground (or some reference potential), and the gate inductor Lg is coupled between the gate of the first transistor 410 and the input 132 of the LNA 130. In this example, the source inductor Ls provides the first transistor 410 with source degeneration (e.g., to improve the linearity of the LNA 130 and/or adjust the input impedance of the LNA 130). It is to be appreciated that the source inductor Ls and/or the gate inductor Lg may be omitted in some implementations. Thus, the gate of the first transistor 410 may be inductively coupled to the input 132 via the gate inductor Lg in some implementations or not in other implementations. Also, the source of the first transistor 410 may be inductively coupled to the ground via the source inductor Ls in some implementations or not in other implementations.

The source of the second transistor 420 is coupled to the drain of the first transistor 410, the gate of the second transistor 420 is configured to receive a bias voltage Vb, and the drain of the second transistor 420 is coupled to the output 134 of the LNA 130. The inductor circuit 425 is coupled between the drain of the second transistor 420 and the supply rail 430, which provides a supply voltage $V_{DD}$. In the example shown in FIG. 4, the inductor circuit 425 includes a load inductor Ld coupled between the drain of the second transistor 420 and the supply rail 430. In FIG. 4, the node between the first transistor 410 and the second transistor 420 is labeled "X" and the node between the second transistor 420 and the load inductor Ld is labeled "Y".

In this example, the first transistor 410 and the second transistor 420 are arranged in a cascode configuration with the first transistor 410 functioning as a common-source amplifier and the second transistor 420 functioning as a common-gate amplifier. The cascode configuration provides high impedance at the drain of the second transistor 420, which helps increase the gain of the LNA 130. In this example, the common-source amplifier may be used as a transconductance device that generates a current at the output (e.g., drain of the first transistor 410) based on the transconductance (i.e., gm) of the device and the voltage at the input (e.g., gate of the first transistor 410). The transconductance device may also be referred to as a gm device, transconductance amplifier, or another term. In this example, the common-gate amplifier may be used as a current buffer that has approximately unity current gain and high output impedance (e.g., high impedance at the drain of the second transistor 420).

In the example in FIG. 4, the LNA 130 also includes a load capacitor Ct and a load resistor Rt. The load capacitor Ct is coupled between the drain of the second transistor 420 and the supply rail 430. In certain aspects, the load capacitor Ct is implemented with a variable capacitor having a tunable (i.e., adjustable) capacitance. In these aspects, the capacitance of the load capacitor Ct may be tuned to adjust the frequency band of the LNA 130 (i.e., provide band selection). In certain aspects, the load resistor Rt is implemented with a variable resistor having a tunable (i.e., adjustable) resistance. In these aspects, the resistance of the load resistor Rt may be tuned to adjust the gain of the LNA 130 (i.e., provide gain selection).

FIG. 4 shows the drain-to-source capacitance Cds1, the gate-to-drain capacitance Cgd1, and the gate-to-source capacitance Cgs1 of the first transistor 410. Although these capacitances are depicted as capacitors coupled to the first transistor 410 in FIG. 4 for purposes of illustration, it is to be appreciated that these capacitances are due to the structure of the first transistor 410.

FIG. 4 also shows the drain-to-source capacitance Cds2, the gate-to-drain capacitance Cgd2, and the gate-to-source capacitance Cgs2 of the second transistor 420. Although these capacitances are depicted as capacitors coupled to the second transistor 420 in FIG. 4 for purposes of illustration, it is to be appreciated that these capacitances are due to the structure of the second transistor 420.

In certain aspects, the output 134 of the LNA 130 may be capacitively coupled to the receive circuit 140 (not shown in FIG. 4) or another device via a coupling capacitor Cs. The coupling capacitor Cs may be used, for example, to block a DC bias voltage at the drain of the second transistor 420 from the receive circuit 140 or the other device capacitively coupled to the output 134.

Figure 5:
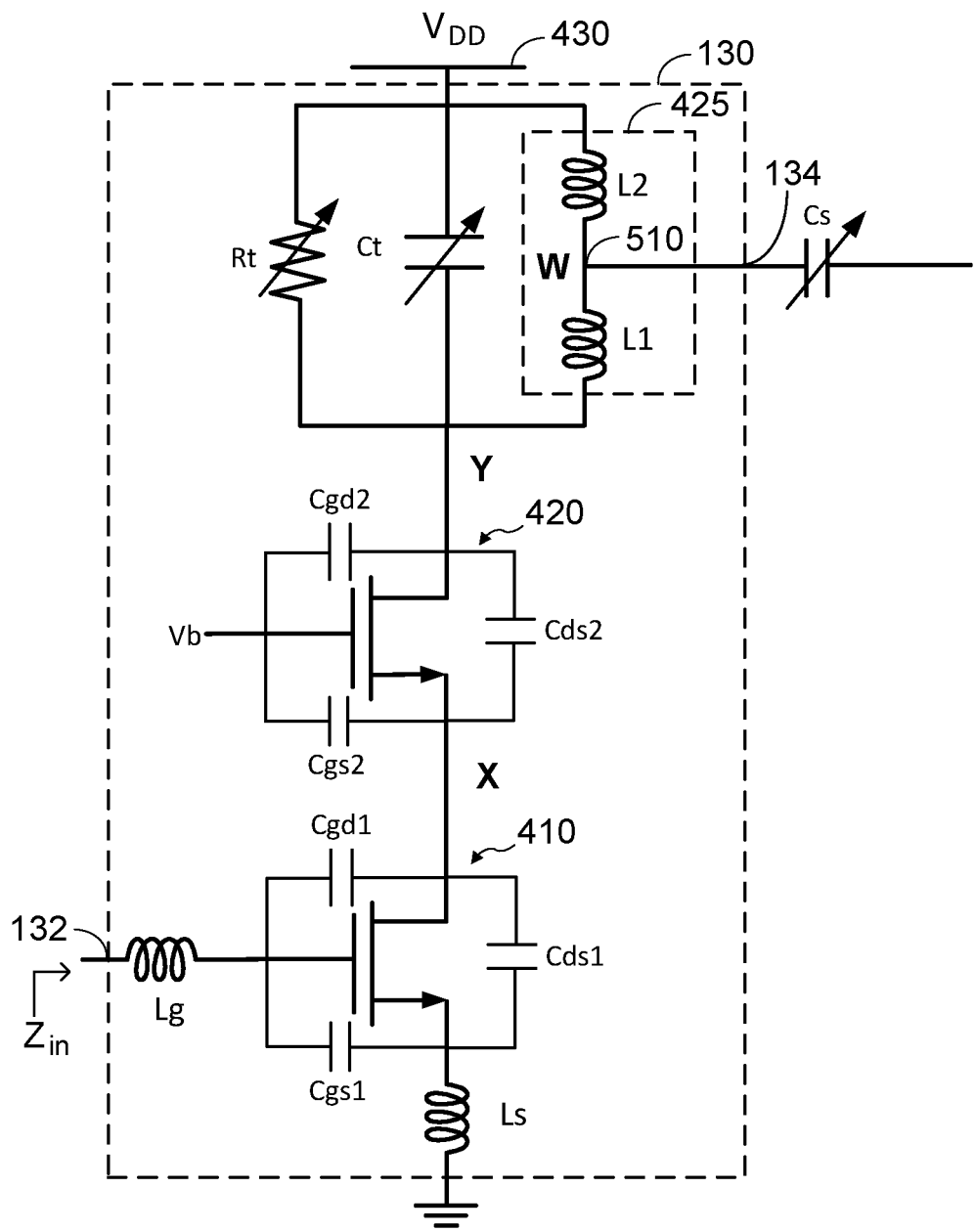
FIG. 5 shows another exemplary implementation of an LNA according to certain aspects of the present disclosure.

FIG. 5 shows another exemplary implementation of the inductor circuit 425 according to certain aspects. In this example, the inductor circuit 425 includes a first load inductor L1 and a second load inductor L2 coupled in series between the drain of the second transistor 420 and the supply rail 430. The output 134 of the LNA 130 is coupled to a node W between the first load inductor L1 and the second load inductor L2.

In one example, the first load inductor L1 and the second load inductor L2 may be physically implemented with two separate inductor structures on a chip. Each of the inductor structures may include a loop structure, a spiral structure, or another type of structure. In another example, the first load inductor L1 and the second load inductor L2 may be implemented with a single inductor structure in which node W is a node on the inductor structure. In this example, the output 134 is coupled to a tap point (i.e., node W) on the inductor structure in which the portion of the inductor structure between node W and the drain of the second transistor 420 provides the first load inductor L1, and the portion of the inductor structure between node W and the supply rail 430 provides the second load inductor L2. The inductor structure may include a loop structure, a spiral structure, or another type of structure.

Figure 6:
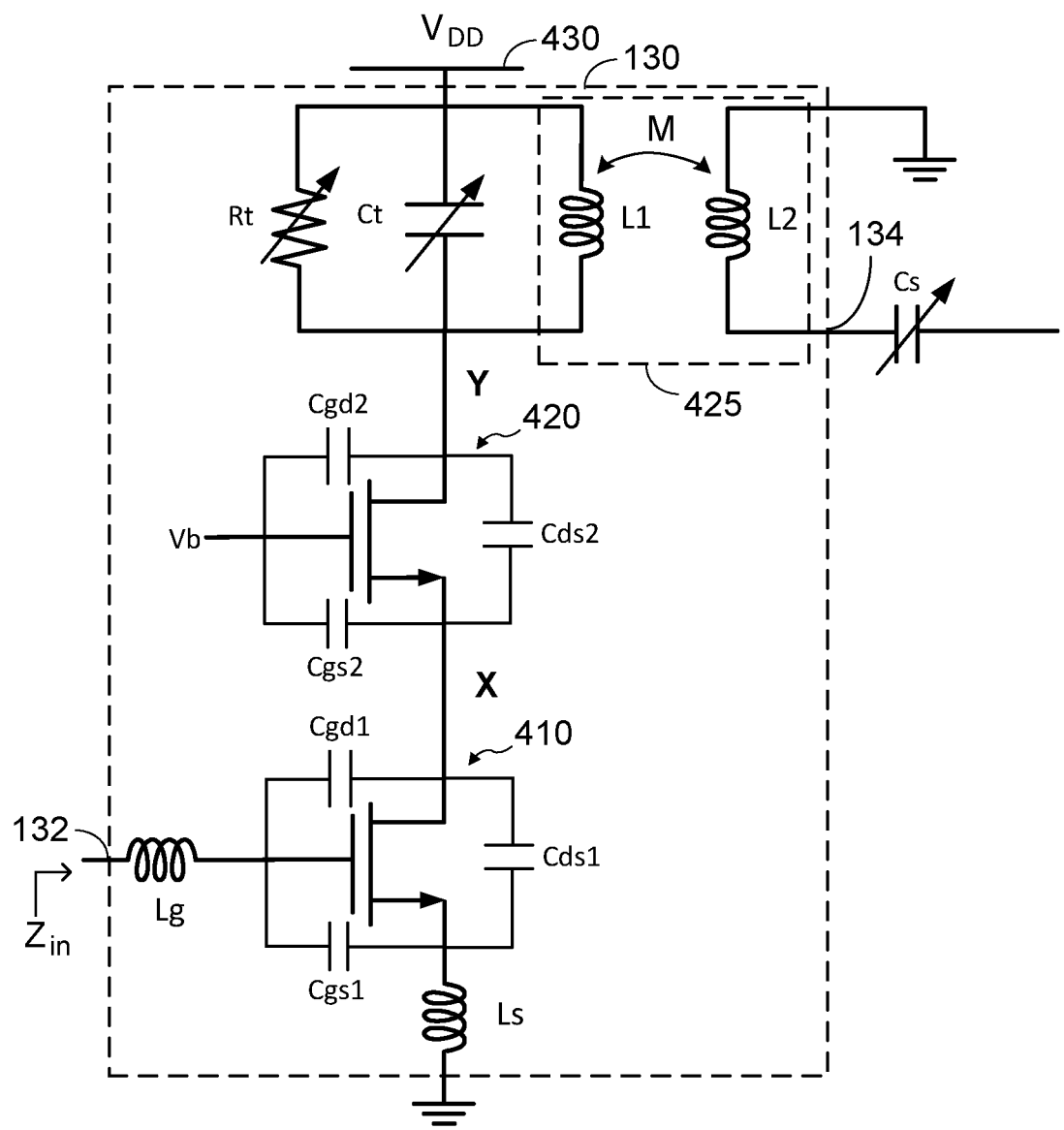
FIG. 6 shows another exemplary implementation of an LNA according to certain aspects of the present disclosure.

FIG. 6 shows another exemplary implementation of the inductor circuit 425 according to certain aspects. In this example, the inductor circuit 425 includes a first load inductor L1 and a second load inductor L2. The first load inductor L1 is coupled between the drain of the second transistor 420 and the supply rail 430, and the second load inductor L2 is coupled between the ground and the output 134 of the LNA 130. In this example, the first load inductor L1 is magnetically coupled with the second load inductor L2. In FIG. 6, the magnetic coupling is indicated by a double arrow between the first load inductor L1 and the second load inductor L2. Since the first load inductor L1 and the second load inductor L2 are magnetically coupled, the first load inductor L1 and the second load inductor L2 form a transformer with a first side of the transformer coupled between the drain of the second transistor 420 and the supply rail 430, and a second side of the transformer coupled between the ground and the output 134. In this example, the magnetic coupling between the first load inductor L1 and the second load inductor L2 transfers RF signal power from the first inductor load L1 to the second load inductor L2.

It is to be appreciated that the inductor circuit 425 is not limited to the exemplary implementations shown in FIGS. 4 to 6. In general, the inductor circuit 425 may include at least one inductor coupled between the drain of the second transistor 420 and the supply rail 430. Also, it is to be appreciated that the present disclosure is not limited to the exemplary load topologies illustrated in FIGS. 4 to 6, and that other load topologies may be used with different load inductor and capacitor configurations. It is also to be appreciated that an inductor may be physically implemented with two or more inductors coupled in series.

As discussed above, the input impedance $Z_{in}$ of the LNA 130 affects the noise figure of the LNA 130. Also, for the example where the filter 120 is coupled to the input 132 of the LNA 130, the input impedance $Z_{in}$ of the LNA 130 affects the performance of the filter 120. To gain a better understanding of the input impedance $Z_{in}$ of the LNA 130, it may be helpful to model the input impedance $Z_{in}$ of the LNA 130 using a small-signal analysis of the LNA 130.

Figure 7B:
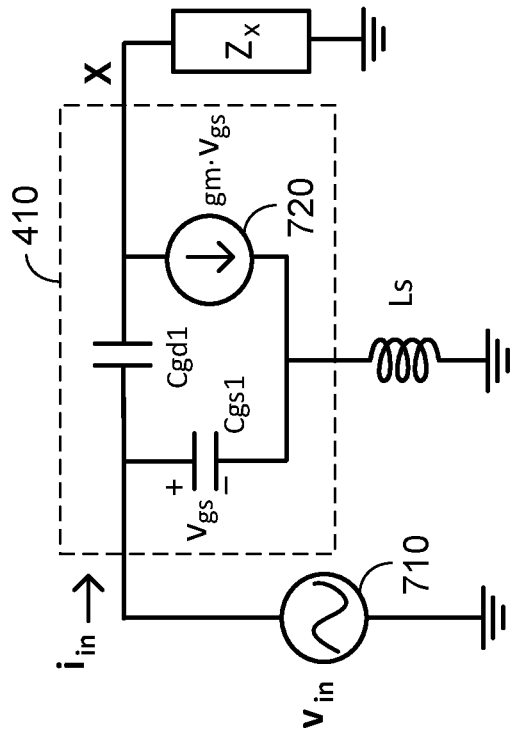
FIG. 7B shows an example of a small-signal model of the LNA according to certain aspects of the present disclosure.
Figure 7A:
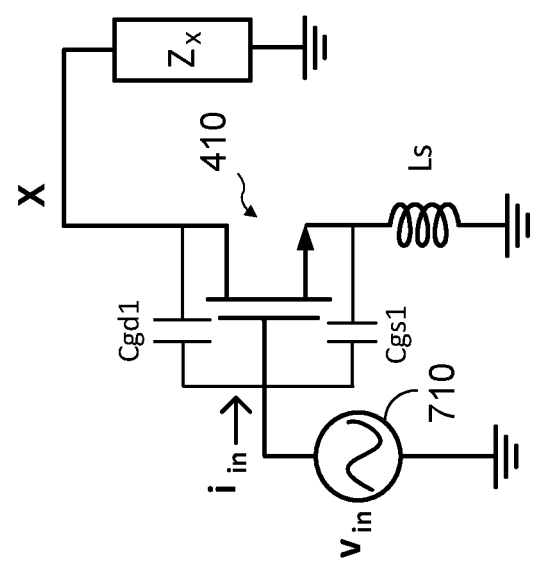
FIG. 7A shows a small-signal voltage source coupled to the input of an LNA for a small-signal analysis of the LNA according to certain aspects of the present disclosure.

In this regard, FIG. 7A illustrates a simplified representation of the LNA 130 with the impedance Zx representing the impedance seen from the drain of the first transistor 410. A small-signal voltage source 710 is coupled to the gate of the first transistor 410 to perform the small-signal analysis. In this example, the input impedance $Z_{in}$ of the LNA 130 is given by where $v_{in}/i_{in}$ is the voltage of the small-signal voltage source 710 and is the small-signal current flowing into the input of the LNA 130. Note that the gate inductor Lg is omitted in the simplified representation of the LNA 130.

FIG. 7B shows an exemplary small-signal model of the first transistor 410. In this example, the transconductance of the first transistor 410 is modeled as a voltage-controlled current source 720 having a current equal to $gm \cdot v_{gs}$ where gm is the transconductance of the first transistor 410 and $v_{gs}$ is the gate-to-source voltage of the first transistor 410. In this example, the input impedance $Z_{in}$ of the LNA 130 (i.e., $v_{in}/i_{in}$) of the LNA 130 in the s domain is given by the following:

$$Z_{in} = \frac{\left(Z_X + \frac{1}{C_{GD}s}\right)(L_1 C_{GS} s^2 + g_m L_S s + 1)}{L_S C_{GS} s^2 + (Z_X C_{GS} + g_m L_S)s + g_m Z_X + \frac{C_{GS}}{C_{GD}} + 1} \quad (1)$$

where $L_s$ is the inductance of the source inductor, $C_{GS}$ is gate-to-source capacitance of the first transistor 410, and $C_{GD}$ is the gate-to-drain capacitance of the first transistor 410.

Figure 7C:
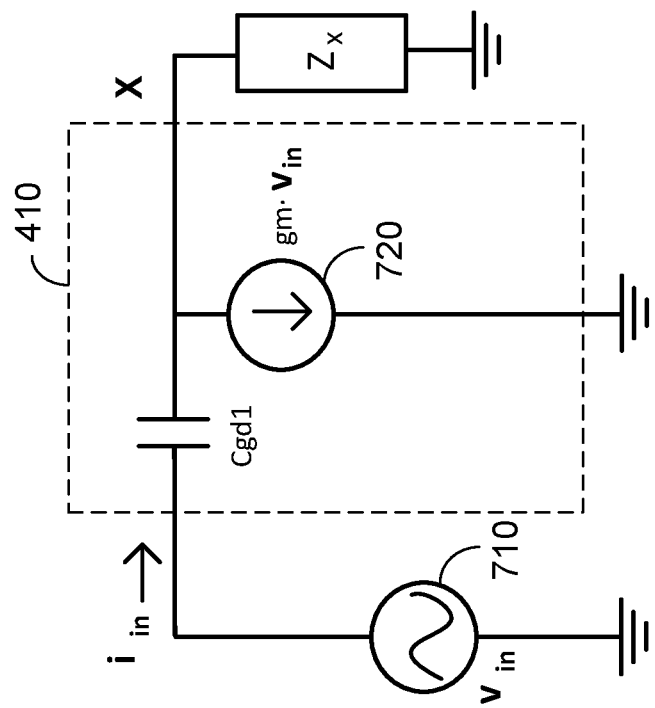
FIG. 7C shows another example of a small-signal model of the LNA according to certain aspects of the present disclosure.

To simplify the above analysis, the source inductor Ls may be ignored resulting in the small-signal model shown in FIG. 7C. In this example, the voltage $v_{in}$ of the voltage source 710 appears across the gate-to-source of the first transistor 410. As a result, the current of the voltage-controlled current source 720 is equal to $gm \cdot v_{in}$, as shown in FIG. 7C. Since the gate-to-source capacitance of the first transistor 410 is in parallel with the voltage source 710 in this example, the gate-to-source capacitance may be ignored. In this example, the input impedance $Z_{in}$ of the LNA 130 (i.e., $v_{in}/i_{in}$) of the LNA 130 in the s domain is given by the following:

$$Z_{in} = \frac{Z_X + \frac{1}{SC_{gd}}}{1 + g_m Z_X}. \quad (2)$$

For the case of a capacitance Cx at the node X (i.e., node between the drain of the first transistor 410 and the source of the second transistor 420), the impedance of Zx in the s domain is given by:

$$Z_X = \frac{1}{SC_X}. \quad (3)$$

Substituting equation (3) for the impedance Zx in equation (2) results in the following:

$$Z_{in} = \frac{C_X + C_{gd}}{g_m C_{gd}} \| \frac{C_X C_{gd}}{C_X + C_{gd}}. \quad (4)$$

As shown in equation (4), the capacitance Cx at node X produces a real impedance at the input of the LNA 130, which increases the real part of the input impedance (i.e., Re{$Z_{in}$}). It can also be seen that the capacitor Cx increases the real part of the input impedance from the fact that the drain of the first transistor 410 is 180 degrees output of phase with the gate of the first transistor 410, which causes the capacitance Cx at the drain to produce a real impedance at the gate of the first transistor 410.

As shown in FIGS. 4 to 6, the second transistor 420 has a drain-to-source capacitance Cds2 that contributes to the capacitance Cx at node X. Since the drain-to-source capacitance Cds2 is between the drain and source of the second transistor 420 (i.e., between node Y and node X), the Miller effect of the second transistor 420 needs to be considered. Accounting for the Miller effect, the contribution of the drain-to-source capacitance Cds2 to the capacitance at node X is given as follows:

$$C_{ds2\_x} = C_{ds2} \cdot \left[1 - \frac{v_y}{v_x}\right] \quad (5)$$

where Cds2_x is the contribution of the capacitance Cds2 to the capacitance at node X, $v_y$ is the voltage the node Y, and $v_x$ is the voltage at node X. Assuming $$\frac{v_y}{v_x}$$

is positive and greater than 1, the capacitance Cds2_x at node X is negative due to the Miller effect. The capacitance Cds2_x may be in the order of a few hundreds of femtofarads which may contribute significantly to the capacitance at node X. Since the capacitance Cds2_x is negative due to the Miller effect, the capacitance Cds2_x decreases the overall capacitance at node X which decreases the real part of the input impedance (i.e., Re{$Z_{in}$}).

A problem with the capacitance Cds2_x being negative is that the capacitance Cds2_x may decrease the real part of the input impedance (i.e., Re{$Z_{in}$}) to a value well below the output impedance $Z_{in}$ of the filter 120, resulting in poor impedance matching between the input 132 of the LNA and the output 124 of the filter 120. As discussed above with reference to FIG. 3, the poor impedance matching can significantly degrade the performance of the filter 120. The decrease in the real part of the input impedance (i.e., Re{$Z_{in}$}) may also degrade the noise figure of the LNA 130.

One approach to address this is to couple an additional capacitor between the node X and ground. In this approach, the capacitance of the additional capacitor increases the capacitance at node X to counter the negative capacitance of Cds2_x. However, the additional capacitor provides an AC path from the node X to the ground. This reduces the signal going to the second transistor 420, which degrades the noise figure of the LNA 130.

In another approach, a resistor is coupled to the input of the LNA 130 to counter the decrease in the real part of the input impedance (i.e., Re{$Z_{in}$}). However, the resistor suffers from thermal noise, which increases noise and degrades the noise figure of the LNA 130.

To address the decrease in the real part of the input impedance (i.e., Re{$Z_{in}$}) caused by the negative capacitance Cds2_x, aspects of the present disclosure provide an input impedance adjustment circuit configured to increase the real part of the input impedance (i.e., Re{$Z_{in}$}) by cancelling the effect of the capacitance Cds2, as discussed further below.

Figure 8:
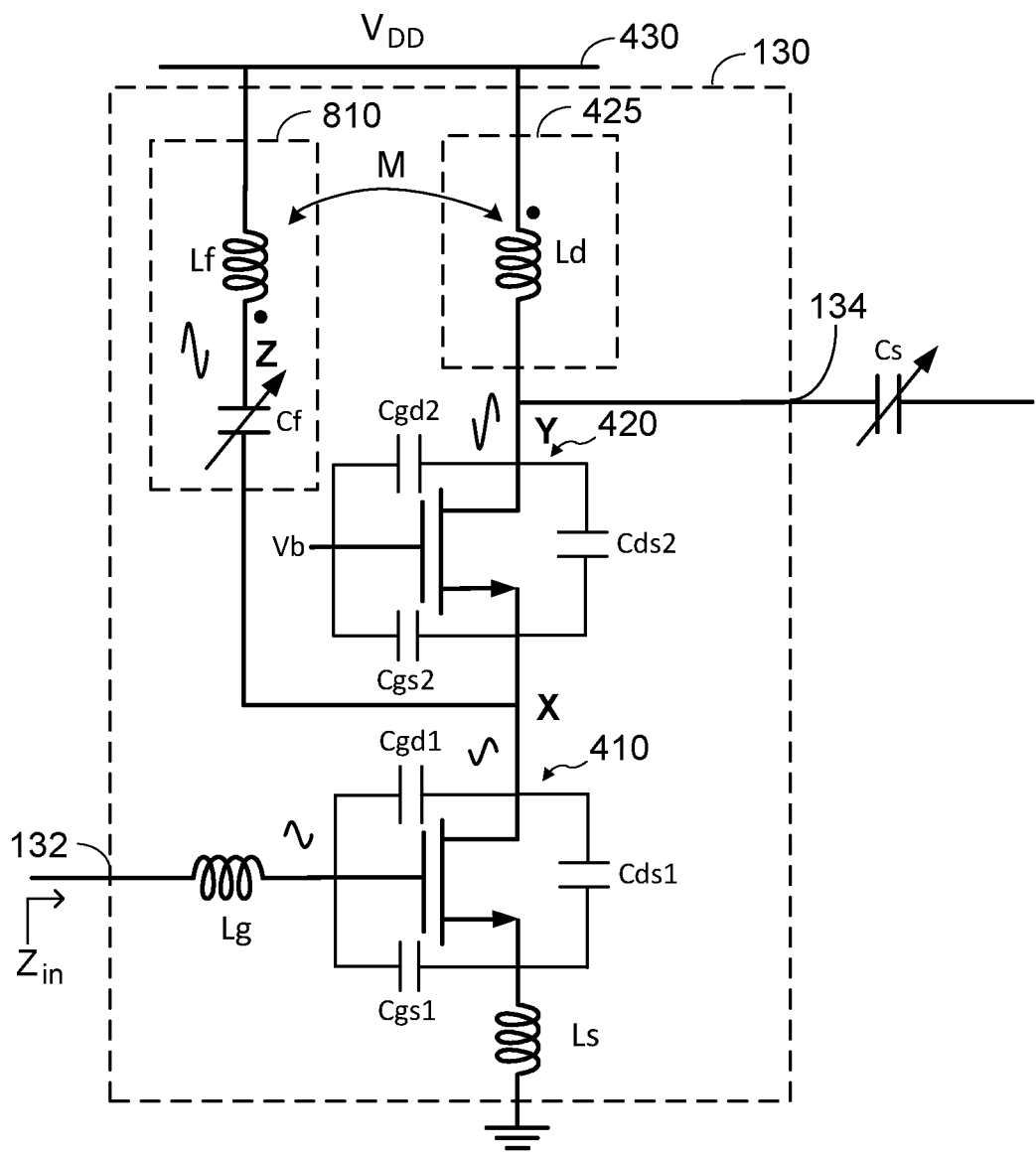
FIG. 8 shows an example of an LNA including an input impedance adjustment circuit according to certain aspects of the present disclosure.

FIG. 8 shows an exemplary input impedance adjustment circuit 810 according to certain aspects. The exemplary input impedance adjustment circuit 810 may be included, for example, in the exemplary LNA 130 shown in FIG. 4 to cancel the effect of the capacitance Cds2. For ease of illustration, the load capacitor Ct and the load resistor Rt are not explicitly shown in FIG. 8.

In the example in FIG. 8, the input impedance adjustment circuit 810 is coupled between the supply rail 430 and node X, where node X is between the drain of the first transistor 410 and the source of the second transistor 420. The input impedance adjustment circuit 810 includes an inductor Lf and a capacitor Cf coupled in series between the supply rail 430 and node X. In FIG. 8, the node between the inductor Lf and the capacitor Cf is labeled "Z".

In certain aspects, the inductor Lf is coupled with the load inductor Ld through negative magnetic coupling. The negative magnetic coupling causes a current flowing in the load inductor Ld to induce a current in the inductor Lf that flows in the opposite direction (i.e., the currents are approximately 180 degrees out of phase with each other). For example, a current in the load inductor Ld flowing towards node X induces a current in the inductor Lf flowing away from node X, and vice versa. Because the currents flow in opposite directions, the currents cancel each other at node X, as discussed further below.

Stated another way, the load inductor Ld and the inductor Lf have opposite polarities. In FIG. 8, the polarity of each of the inductors Ld and Lf is indicated by the location of a respective dot. As shown in FIG. 8, the location of the dot for the inductor Lf is reversed with respect to the location of the dot for the load inductor Ld, indicating that the load inductor Ld and the inductor Lf have opposite polarities.

Because the load inductor Ld and the inductor Lf are magnetically coupled, the load inductor Ld and the inductor Lf form a transformer, in which the load inductor Ld corresponds to a first side (i.e., first winding) of the transformer and the inductor Lf corresponds to a second side (i.e., second winding) of the transformer. In this example, the first side and the second side of the transformer have opposite polarities, and the negative magnetic coupling between the load inductor Ld and the inductor Lf may also be referred to as negative transformer coupling.

In this example, the negative magnetic coupling (i.e., negative transformer coupling) between the load inductor Ld and the inductor Lf causes the voltage at node Z and the voltage at node Y to be approximately 180 degrees out of phase with each other (i.e., the voltage at node Z and the voltage at node Y are 180 degrees phase shifted voltages). As a result, the capacitor Cf (which is between node Z and node X) and capacitance Cds2 (which is between node Y and X) have voltages that are approximately 180 degrees out of phase with each other. This causes the capacitor Cf and capacitance Cds2 to have currents that are approximately 180 degrees out of phase with each other. If the magnitudes of these currents are made equal, then these currents cancel each other at node X, which cancels the effect of the capacitance Cds2 on the real part of the input impedance (i.e., Re{$Z_{in}$}). The condition for cancellation is given by:

$$|(V_Y - V_X)j\omega C_{ds2}| = |(V_Z - V_X)j\omega C_f| \qquad (6)$$

where $V_Y$ is the voltage at node Y, $V_X$ is the voltage at node X, $V_Z$ is the voltage at node Z, and Cf in equation (6) is the capacitance of capacitor Cf.

By cancelling the effect of the capacitance Cds2, the input impedance adjustment circuit 810 increases the real part of the input impedance (i.e., Re{$Z_{in}$}) compared with the case with no cancellation. For example, the input impedance adjustment circuit 810 may increase the real part of the input impedance (i.e., Re{$Z_{in}$}) to provide better impedance matching between the input 132 of the LNA and the output 124 of the filter 120, thereby improving the performance of the filter 120.

It is to be appreciated that the input impedance adjustment circuit 810 is not limited to cases where the effect of the capacitance Cds2 is completely canceled out (i.e., the condition in equation (6) is exactly met). For example, in certain aspects, the input impedance adjustment circuit 810 may partially cancel the effect of the capacitance Cds2 (e.g., cancel a portion of the current of Cds2 at node X). In these aspects, the partial cancellation of the effect of Cds2 increases the real part of the input impedance (i.e., Re{$Z_{in}$}) compared with the case of no cancellation. The increase in the real part of the input impedance (i.e., Re{$Z_{in}$}) may be used, for example, to improve impedance matching between the LNA 130 and the filter 120 by increasing the real part of the input impedance (i.e., Re{$Z_{in}$}) to a value more closely matching the output impedance $Z_{in}$ of the filter 120.

In certain aspects, the capacitor Cf is a variable capacitor having a tunable capacitance. For example, the capacitor Cf may be implemented with a switched capacitor bank, one or more varactors, or the like. An exemplary implementation of a switched capacitor bank is discussed further below with reference to FIG. 15. In these aspects, the capacitance of the capacitor Cf may be tuned (i.e., adjusted) to tune the real part of the input impedance Re{$Z_{in}$}. For example, the capacitor Cf may be tuned to tune the real part of the input impedance Re{$Z_{in}$} to a value more closely matching the output impedance $Z_{in}$ of the filter 120 for improved impedance matching.

Figure 9:
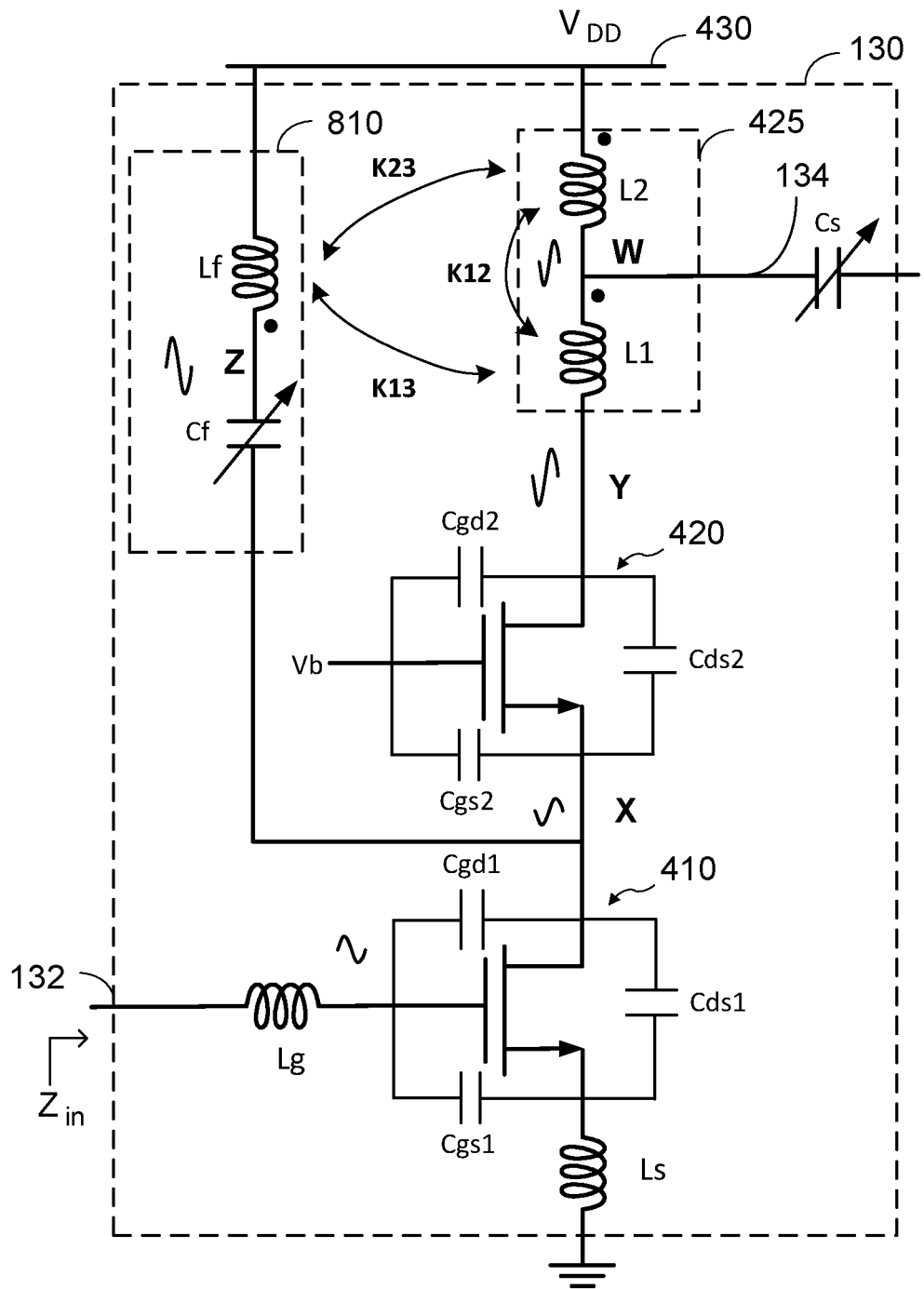
FIG. 9 shows another example of an LNA including an input impedance adjustment circuit according to certain aspects of the present disclosure.

FIG. 9 shows an example in which the exemplary input impedance adjustment circuit 810 is included in the exemplary implementation of the LNA 130 shown in FIG. 5 to cancel the effect of the capacitance Cds2. For ease of illustration, the load capacitor Ct and the load resistor Rt are not explicitly shown in FIG. 9.

In the example in FIG. 9, the input impedance adjustment circuit 810 is coupled between the supply rail 430 and node X, where node X is between the drain of the first transistor 410 and the source of the second transistor 420. As shown in FIG. 9, the inductor Lf and the capacitor Cf are coupled in series between the supply rail 430 and node X.

In one example, the inductor Lf is coupled with the first load inductor L1 through a first negative magnetic coupling (labeled "K13") and coupled with the second load inductor L2 through a second negative magnetic coupling (labeled "K23"). The first load inductor L1 and the second load inductor L2 may also be magnetically coupled (labeled "K12"). Stated another way, the inductor Lf and the first load inductor L1 have opposite polarities, and the inductor Lf and the second load inductor L2 have opposite polarities. In FIG. 9, the polarity of each of the inductors L1, L2, and Lf is indicated by the location of a respective dot.

Because the inductor Lf is magnetically coupled with the first load inductor L1 and magnetically coupled with the second load inductor L2 in this example, the inductor Lf forms a transformer with the first load inductor L1 and the second load inductor L2. In this example, the negative magnetic coupling between the inductor Lf and the first load inductor L1 causes the current flowing in the first load inductor L1 to induce a current in the inductor Lf that flows in the opposite direction (i.e., the currents in the inductors Lf and L1 are approximately 180 degrees out of phase). Also, the negative magnetic coupling between the inductor Lf and the second load inductor L2 causes the current flowing in the second load inductor L2 to induce a current in the inductor Lf that flows in the opposite direction (i.e., the currents in the inductors Lf and L2 are approximately 180 degrees out of phase).

The opposite current flows cause the voltage at node Z and the voltage at node Y to be approximately 180 degrees out of phase with each other (i.e., the voltage at node Z and the voltage at node Y are 180 degrees phase shifted voltages). As a result, the capacitor Cf (which is between node Z and node X) and capacitance Cds2 (which is between node Y and X) have voltages that are approximately 180 degrees out of phase with each other. This causes the capacitor Cf and capacitance Cds2 to have currents that are approximately 180 degrees out of phase with each other. As a result, the current flowing through capacitor Cf cancels the current flowing through Cds2 at node X, and therefore cancels the effect of the capacitance Cds2 on the real part of the input impedance (i.e., Re{$Z_{in}$}). As discussed above, the capacitor Cf completely cancels the effect of the capacitance Cds2 when the condition in equation (6) is satisfied.

As discussed above, the capacitor Cf increases the real part of the input impedance (i.e., Re{$Z_{in}$}) by cancelling the effect of the capacitance Cds2. As also discussed above, the capacitor Cf may be a variable capacitor (e.g., a switched capacitor bank, one or more varactors, or the like) having a tunable capacitance. In this example, the capacitance of the capacitor Cf may be tuned (i.e., adjusted) to tune the real part of the input impedance Re{$Z_{in}$}. For example, the capacitor Cf may be tuned to tune the real part of the input impedance Re{$Z_{in}$} to a value more closely matching the output impedance $Z_{in}$ of the filter 120 for improved impedance matching.

It is to be appreciated that the present disclosure is not limited to the example where the inductor Lf is magnetically coupled with both load inductors L1 and L2. For example, in some implementations, the inductor Lf may be coupled with one of the first load inductor L1 and the second load inductor L2 through negative magnetic coupling. In these implementations, the negative magnetic coupling causes the current flowing through the capacitor Cf to cancel the current flowing through Cds2 at node X, and thus cancel the effect of Cds2 on the real part of the input impedance (i.e., Re{$Z_{in}$}), as discussed above. Thus, the inductor Lf may be magnetically coupled with one or both of the load inductors L1 and L2.

Figure 10A:
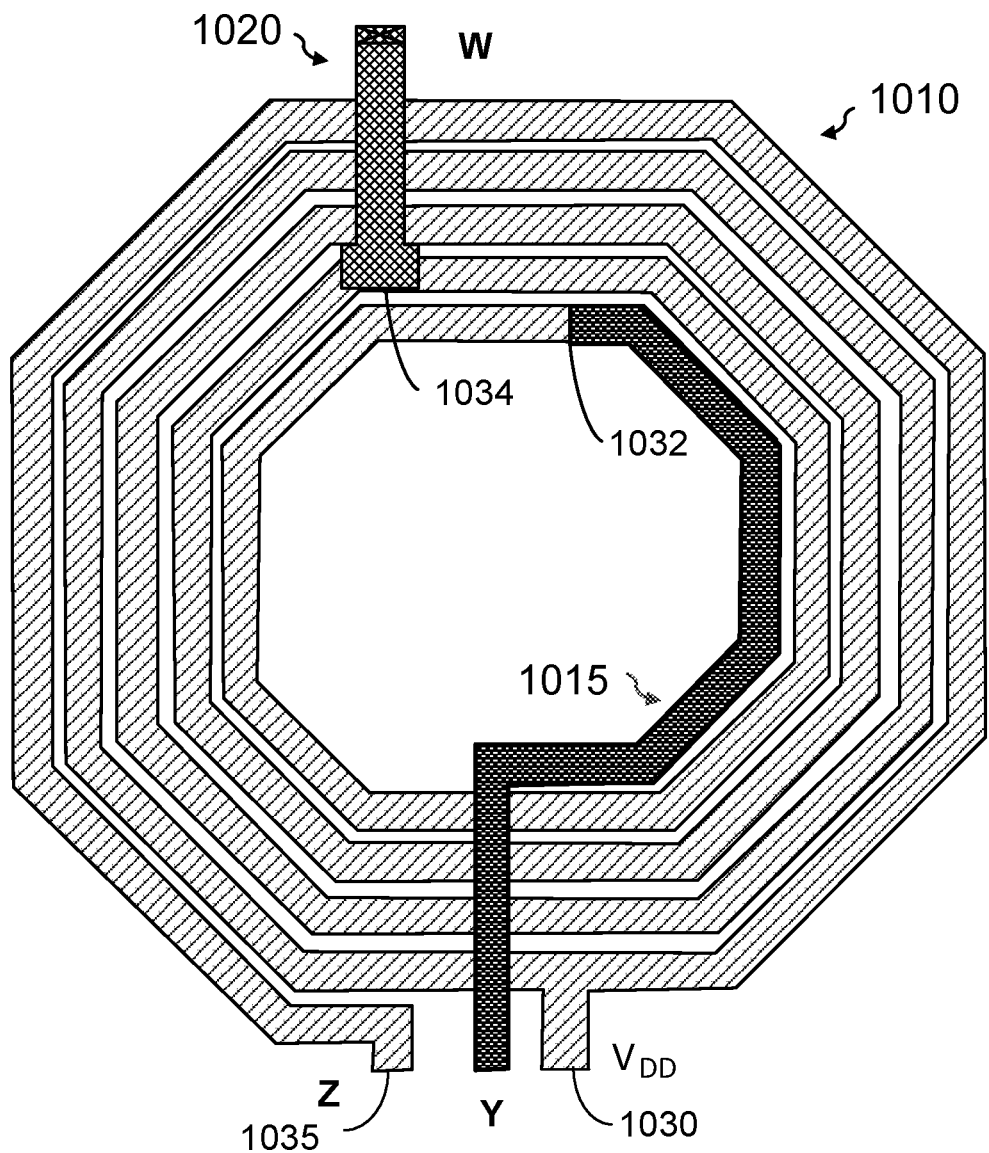
FIG. 10A shows an exemplary implementation of inductors according to certain aspects of the present disclosure.

FIG. 10A shows an exemplary implementation of the inductor Lf, the first load inductor L1, and the second load inductor L2 according to certain aspects. In this example, the inductor Lf, the first load inductor L1, and the second load inductor L2 are implemented with a single inductor structure 1010 (e.g., spiral inductor structure). The inductor structure 1010 is formed from a metal layer on a die (e.g., using photolithographic and etching processes).

In this example, a first contact area 1032 of the inductor structure 1010 is coupled to node Y via a first interconnect 1015 (e.g., first metal interconnect). The first interconnect 1015 may be formed from a second metal layer on the die (e.g., using photolithographic and etching processes) and electrically coupled to the first contact area 1032 of the inductor structure 1010 through a via (not shown). In this example, the first contact area 1032 is located at a first end of the inductor structure 1010.

In this example, a second contact area 1034 of the inductor structure 1010 is coupled to node W via a second interconnect 1020 (e.g., second metal interconnect). The second interconnect 1020 may be formed from the second metal layer and electrically coupled to the second contact area 1034 of the inductor structure 1010 through a via (not shown).

A third contact area 1030 of the inductor structure 1010 is coupled to the supply rail 430. For example, the third contact area 1030 may be coupled to the supply rail 430 through a metal interconnect (not shown) or another structure.

A fourth contact area 1035 of the inductor structure 1010 is coupled to node Z (i.e., the capacitor Cf). For example, the fourth contact area 1035 may be coupled to node Z through a metal interconnect (not shown) or another structure. In this example, the fourth contact area 1035 is located at a second end of the inductor structure 1010.

In this example, the portion of the inductor structure 1010 between the first contact area 1032 and the second contact area 1034 forms the first load inductor L1, the portion of the inductor structure 1010 between the second contact area 1034 and the third contact area 1030 forms the second load inductor L2, and the portion of the inductor structure 1010 between the third contact area 1030 and the fourth contact area 1035 forms the inductor Lf. In this example, the inductor structure 1010 forms an auto transformer in which the magnetic coupling between the different portions of the inductor structure 1010 provide the magnetic coupling (i.e., K12, K23, and K13) between the inductors L1, L2, and Lf.

Figure 10B:
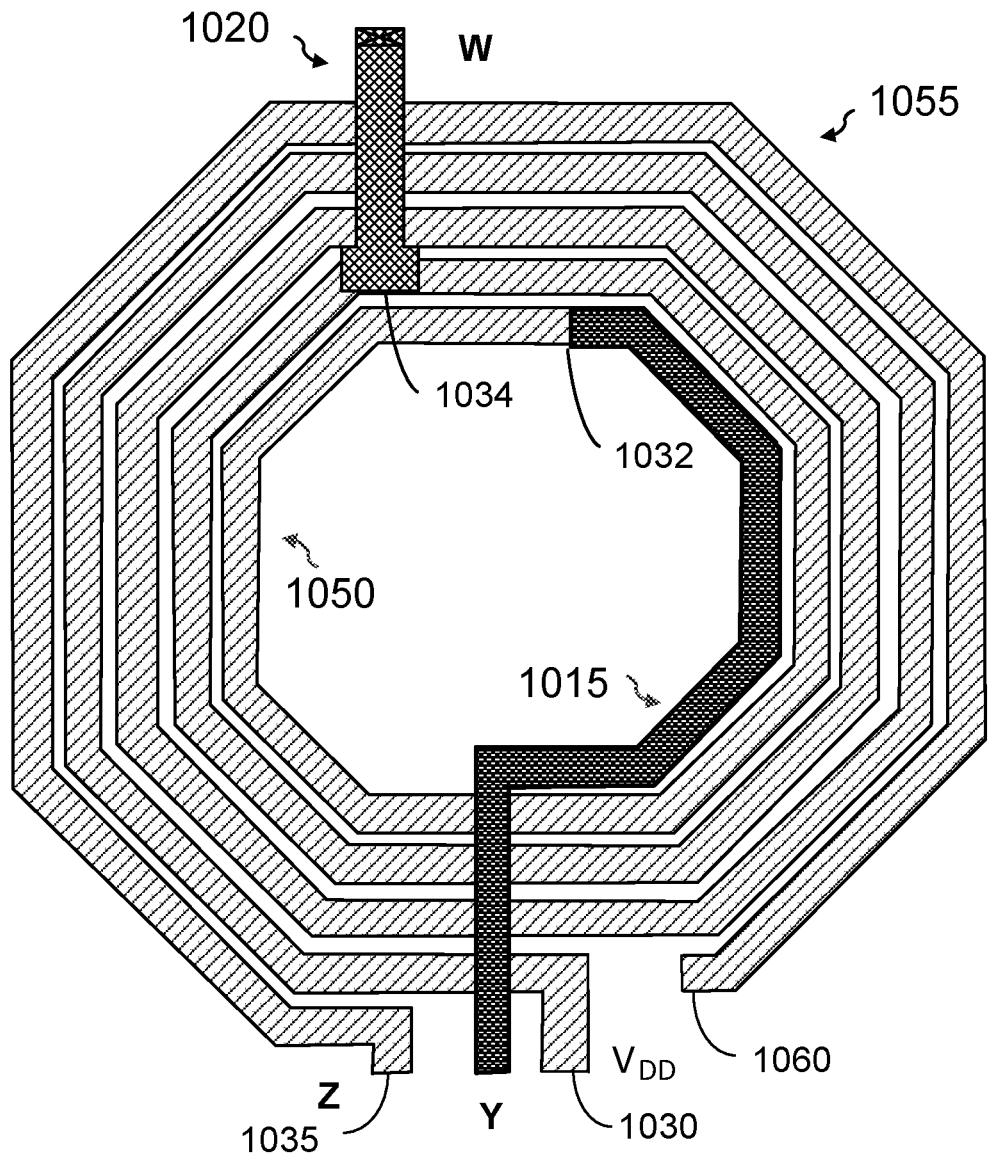
FIG. 10B shows another exemplary implementation of inductors according to certain aspects of the present disclosure.

It is to be appreciated that the present disclosure is not limited to the example shown in FIG. 10A. For example, in some implementations, the load inductors L1 and L2 may be implemented with a first inductor structure 1050, and the inductor Lf may be implemented with a second inductor structure 1055 that is separate from the first inductor structure 1050, an example of which is shown in FIG. 10B. In this example, the first inductor structure 1050 and the second inductor structure 1055 may be formed from the same metal layer or separate metal layers (e.g., using photolithographic and etching processes).

In the example in FIG. 10B, the first contact area 1032 is on the first inductor structure 1050 and coupled to node Y through the first interconnect 1015, the second contact area 1034 is on the first inductor structure 1050 and coupled to node W through the second interconnect 1020, and the third contact area 1030 is on the first inductor structure 1050 and coupled to the supply rail 430. The fourth contact area 1035 is on the second inductor structure 1055 and coupled to node Z. A fifth contact area 1060 on the second inductor structure 1055 may be coupled to the supply rail 430 or ground.

It is to be appreciated that, in some implementations, the first load inductor L1 and the second load inductor L2 may be implemented with separate inductor structures. The separate inductor structures may be formed from the same metal layer or separate metal layers.

Figure 11:
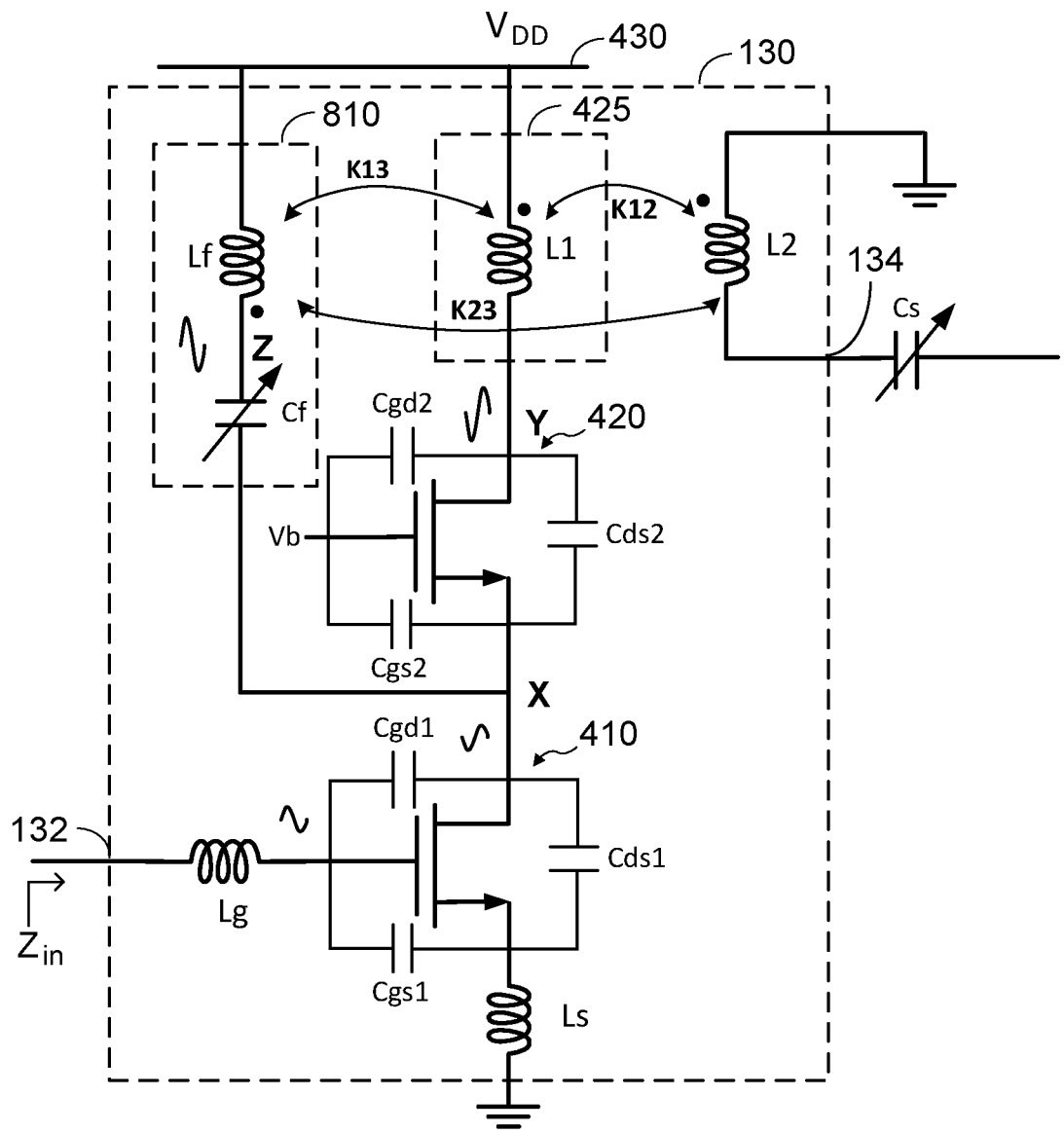
FIG. 11 shows another example of an LNA including an input impedance adjustment circuit according to certain aspects of the present disclosure.

FIG. 11 shows an example in which the exemplary input impedance adjustment circuit 810 is included in the exemplary implementation of the LNA 130 shown in FIG. 6 to cancel the effect of the capacitance Cds2. For ease of illustration, the load capacitor Ct and the load resistor Rt are not explicitly shown in FIG. 11.

In the example in FIG. 11, the input impedance adjustment circuit 810 is coupled between the supply rail 430 and node X, where node X is between the drain of the first transistor 410 and the source of the second transistor 420. As shown in FIG. 11, the inductor Lf and the capacitor Cf are coupled in series between the supply rail 430 and node X.

In this example, the inductor Lf is coupled with the first load inductor L1 through negative magnetic coupling (labeled "K13"). As discussed above with reference to FIG. 8, the negative magnetic coupling causes a current flowing in the first load inductor L1 to induce a current in the inductor Lf that flows in the opposite direction (i.e., the currents are approximately 180 degrees out of phase with each other).

The opposite current flows cause the voltage at node Z and the voltage at node Y to be approximately 180 degrees out of phase with each other (i.e., the voltage at node Z and the voltage at node Y are 180 degrees phase shifted voltages). As a result, the capacitor Cf (which is between node Z and node X) and capacitance Cds2 (which is between node Y and X) have voltages that are approximately 180 degrees out of phase with each other. This causes the capacitor Cf and capacitance Cds2 to have currents that are approximately 180 degrees out of phase with each other. As a result, the current flowing through capacitor Cf cancels the current flowing through Cds2 at node X, and therefore cancels the effect of the capacitance Cds2 on the real part of the input impedance (i.e., $Re\{Z_{in}\}$). As discussed above, the capacitor Cf completely cancels the effect of the capacitance Cds2 when the condition in equation (6) is satisfied.

As discussed above, the capacitor Cf increases the real part of the input impedance (i.e., $Re\{Z_{in}\}$) by cancelling the effect of the capacitance Cds2. As also discussed above, the capacitor Cf may be a variable capacitor (e.g., a switched capacitor bank, one or more varactors, or the like) having a tunable capacitance. In this example, the capacitance of the capacitor Cf may be tuned (i.e., adjusted) to tune the real part of the input impedance $Re\{Z_{in}\}$. For example, the capacitor Cf may be tuned to tune the real part of the input impedance $Re\{Z_{in}\}$ to a value more closely matching the output impedance $Z_{in}$ of the filter 120 for improved impedance matching.

The inductor Lf may also be coupled with the second load inductor L2 through negative magnetic coupling. In this example, the first load inductor L1 and the second load inductor L2 may have the same polarity. As discussed above with reference to FIG. 6, the first load inductor L1 is magnetically coupled with the second load inductor L2 (e.g., to provide output impedance matching).

Figure 12:
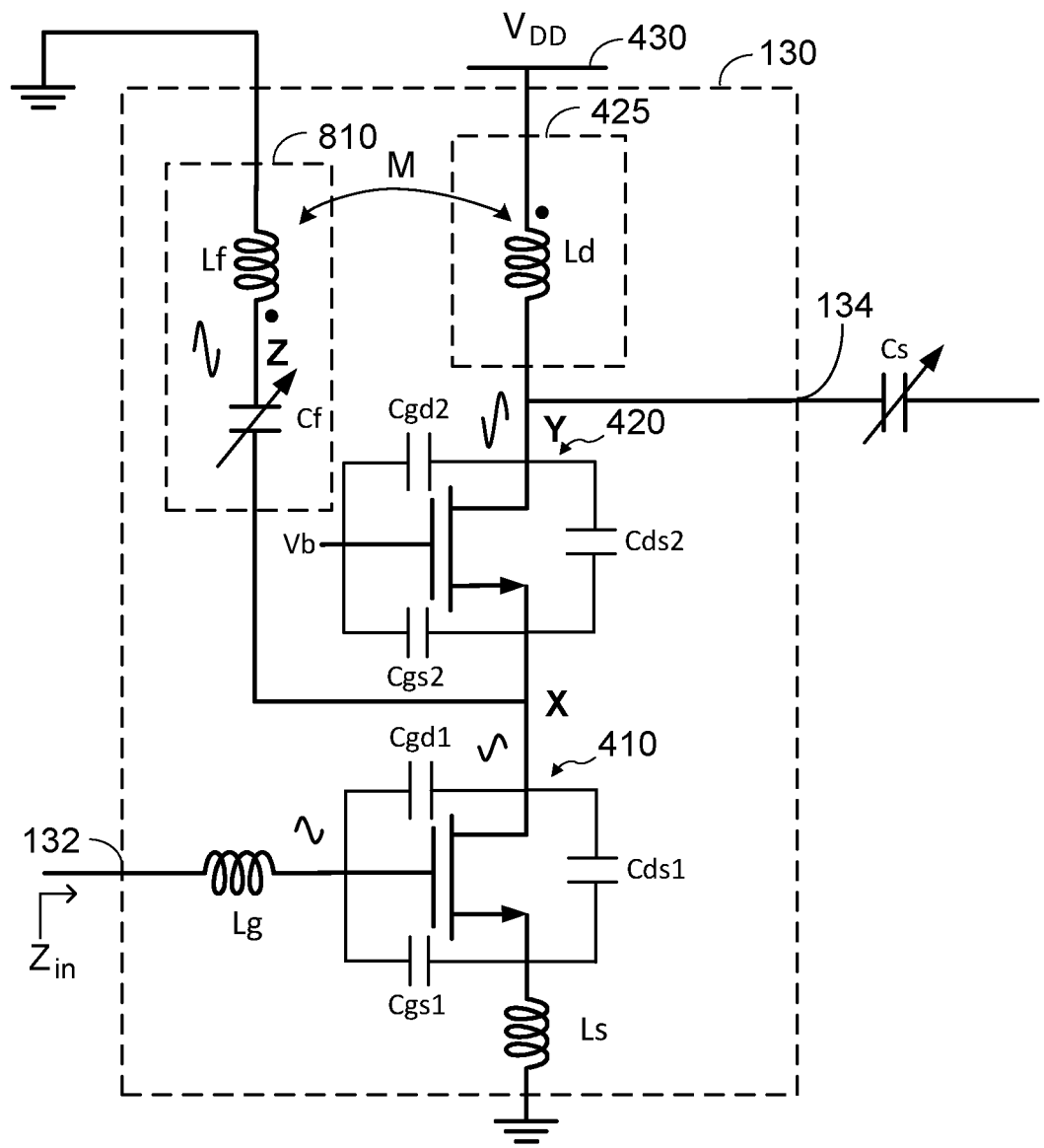
FIG. 12 shows another example of an LNA including an input impedance adjustment circuit according to certain aspects of the present disclosure.

It is to be appreciated that the input impedance adjustment circuit 810 is not limited to being coupled between the supply rail 430 and node X. For example, in some implementations, the input impedance adjustment circuit 810 may be coupled between another supply rail and node X or between ground and node X. In this regard, FIG. 12 shows an example in which the input impedance adjustment circuit 810 is coupled between the ground and the node X in the exemplary implementation of the LNA 130 shown in FIG. 4. In this example, the inductor Lf is coupled with the load inductor Ld through negative magnetic coupling. As discussed above, the negative magnetic coupling (also referred to as negative transformer coupling) causes the capacitor Cf to cancel the effect of the capacitance Cds2 on the real part of the input impedance (i.e., $Re\{Z_{in}\}$), which increases the real part of the input impedance (i.e., $Re\{Z_{in}\}$).

Figure 13:
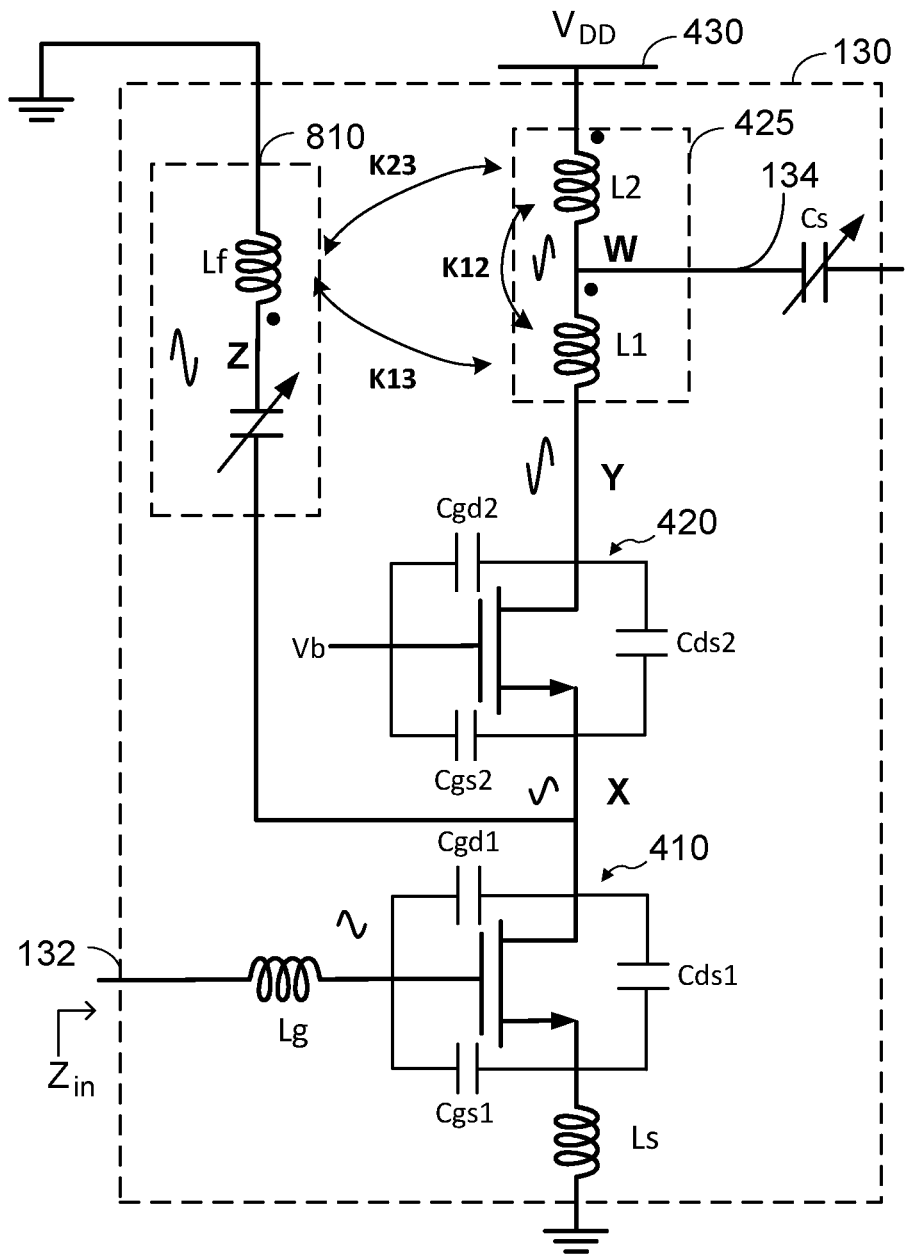
FIG. 13 shows another example of an LNA including an input impedance adjustment circuit according to certain aspects of the present disclosure.

FIG. 13 shows an example in which the input impedance adjustment circuit 810 is coupled between the ground and the node X in the exemplary implementation of the LNA 130 shown in FIG. 5. In some implementations, the inductor Lf is coupled with the first load inductor L1 through a first negative magnetic coupling and coupled with the second load inductor L2 through a second negative magnetic coupling. In other implementations, the inductor Lf may be coupled with one of the load inductors L1 and L2 through negative magnetic coupling. As discussed above, the negative magnetic coupling (also referred to as negative transformer coupling) causes the capacitor Cf to cancel the effect of the capacitance Cds2 on the real part of the input impedance (i.e., $Re\{Z_{in}\}$), which increases the real part of the input impedance (i.e., $Re\{Z_{in}\}$). In this example, the load inductors L1 and L2 may be implemented with a first inductor structure (e.g., first inductor structure 1050) and the inductor Lf may be implemented with a second inductor structure (e.g., second inductor structure 1055 with the fifth contact area 1060 coupled to ground).

Figure 14:
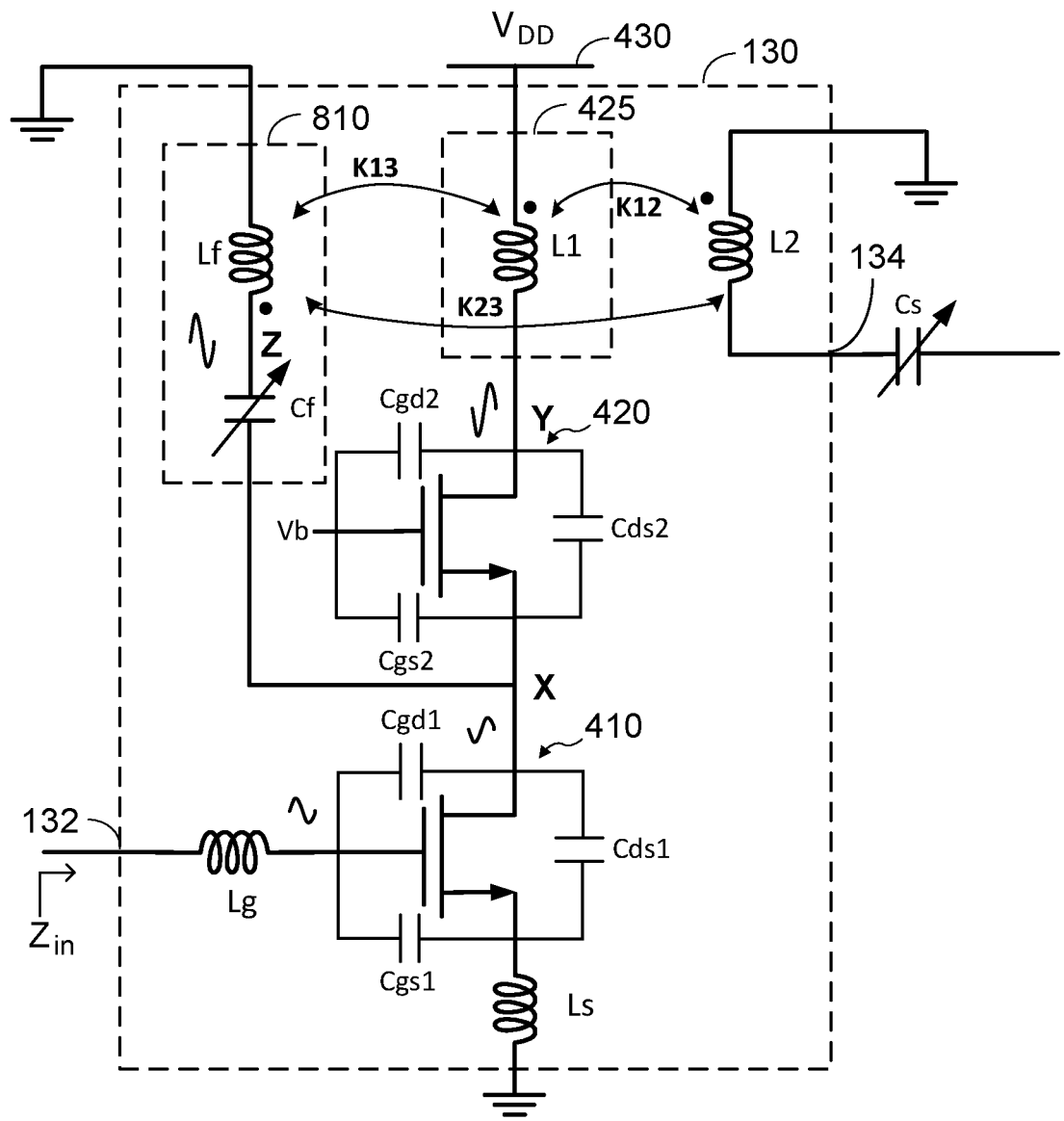
FIG. 14 shows another example of an LNA including an input impedance adjustment circuit according to certain aspects of the present disclosure.

FIG. 14 shows an example in which the input impedance adjustment circuit 810 is coupled between the ground and the node X in the exemplary implementation of the LNA 130 shown in FIG. 6. In this example, the inductor Lf is coupled with the first load inductor L1 through negative magnetic coupling. As discussed above, the negative magnetic coupling (also referred to as negative transformer coupling) causes the capacitor Cf to cancel the effect of the capacitance Cds2 on the real part of the input impedance (i.e., $Re\{Z_{in}\}$), which increases the real part of the input impedance (i.e., $Re\{Z_{in}\}$).

Figure 15:
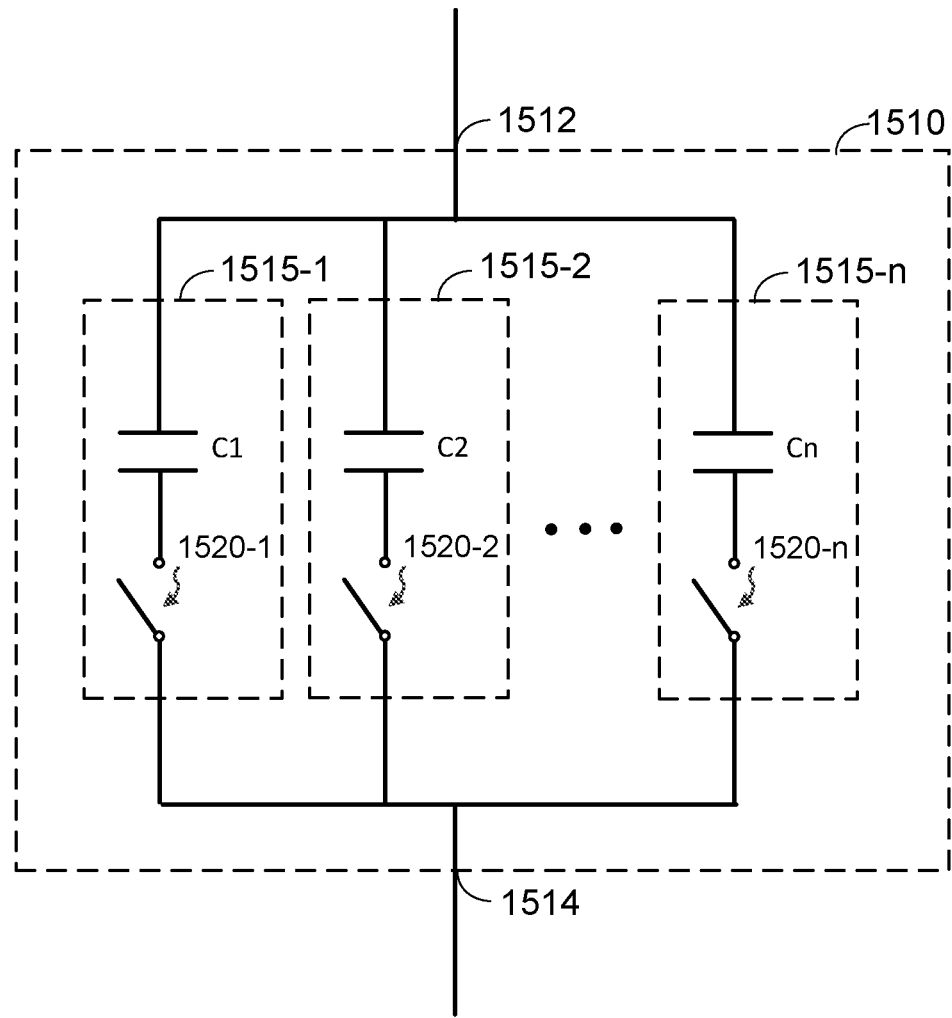
FIG. 15 shows an exemplary implementation of a variable capacitor according to certain aspects of the present disclosure.

FIG. 15 shows an example of a variable capacitor 1510 that may be used to implement the capacitor Cf according to certain aspects. The variable capacitor 1510 includes multiple switching-capacitor circuits 1515-1 to 1515-n coupled in parallel between a first terminal 1512 and a second terminal 1514. Each of the switching-capacitor circuits 1515-1 to 1515-n includes a respective capacitor C1 to Cn and a respective switch 1520-1 to 1520-n coupled in series with the respective capacitor C1 to Cn.

For the example where the variable capacitor 1510 implements the capacitor Cf, the first terminal 1512 may be coupled to one of node Z, the supply rail 430, and ground, and the second terminal 1514 may be coupled to another one of node Z, the supply rail 430, and ground.

In this example, the capacitance of the variable capacitor 1510 is tuned by controlling the on/off states of the switches 1520-1 to 1520-n. For example, the capacitance of the variable capacitor 1510 may be increased by increasing the number of the switches 1520-1 to 1520-n that are turned on, and the capacitance of the variable capacitor 1510 may be decreased by decreasing the number of the switches 1520-1 to 1520-n that are turned on. For the example where the variable capacitor 1510 implements the capacitor Cf, the capacitance of the variable capacitor 1510 may be tuned to tune the increase in the real part of the input impedance (i.e., Re{$Z_{in}$}), as discussed above.

Each of the switches 1520-1 to 1520-n may be implemented with a respective transistor (e.g., NFET or PFET), a respective transmission gate, or another type of switch. For the example where a switch is implemented with a respective transistor, the switch is turned on or off by controlling the voltage at the gate of the respective transistor. In this example, the drain of the transistor is coupled to the respective one of the capacitors C1 to Cn or one of the terminals 1512 or 1514, and the source of the transistor is coupled to another one of the respective one of the capacitors C1 to Cn or one of the terminals 1512 or 1514.

Figure 16:
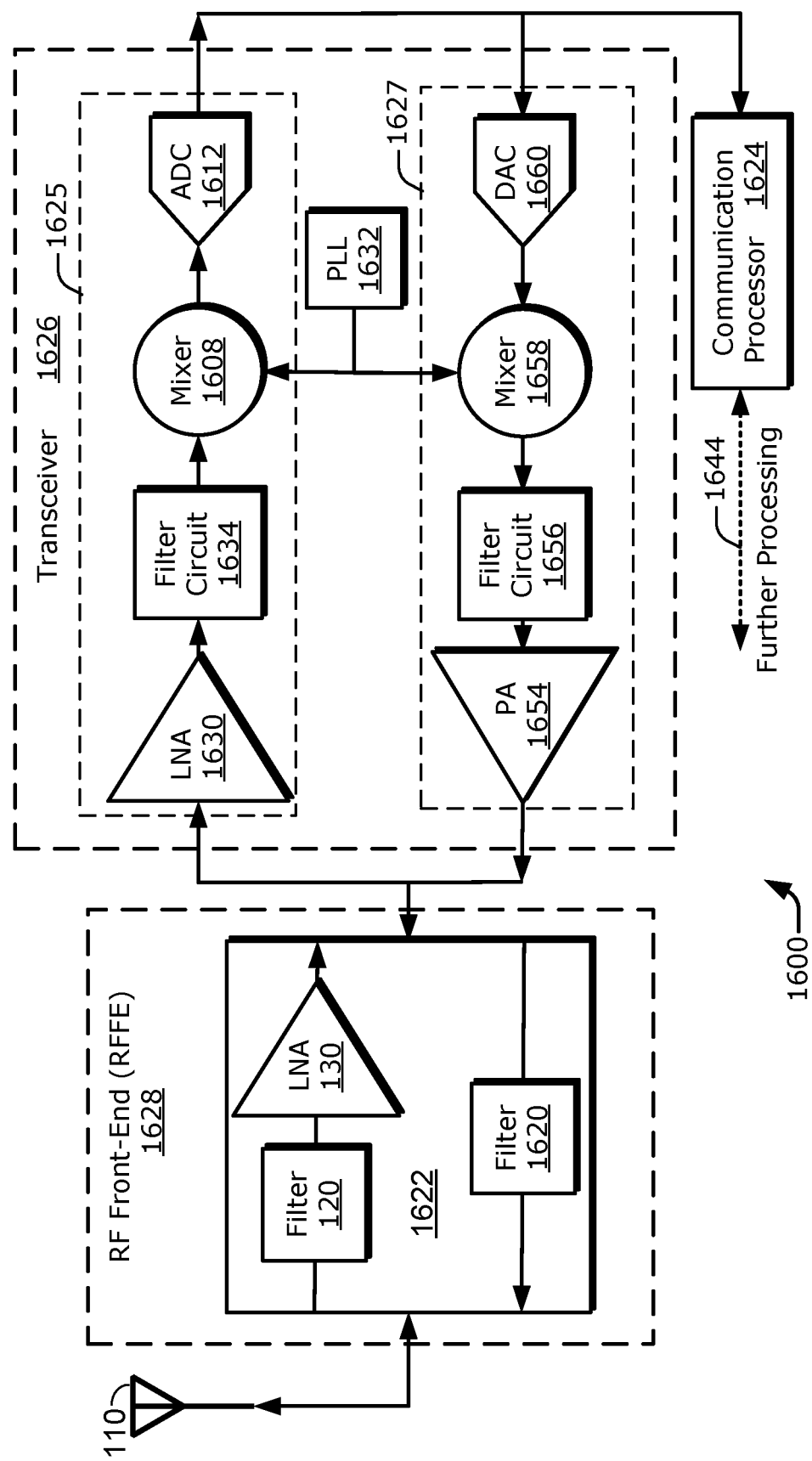
FIG. 16 shows an example of a wireless device in which aspects of the present disclosure may be used according to certain aspects of the present disclosure.

FIG. 16 shows an example of a wireless device 1600 in which aspects of the present disclosure may be used. In this example, the wireless device 1600 includes a transceiver 1626, an RF front-end 1628, the antenna 110, and a communication processor 1624. The communication processor 1624 communicates one or more data signals to other components, such as an application processor, for further processing (e.g., for processing at an application level).

As illustrated from left to right, in example implementations, the antenna 110 is coupled to the RF front-end 1628, and the RF front-end 1628 is coupled to the transceiver 1626. The transceiver 1626 is coupled to the communication processor 1624. The example RF front-end 1628 includes at least one signal propagation path 1622. The RF front-end 1628 may include at least one filter, such as the filter 120 and filter 1620. The RF front-end 1628 may also include the LNA 130 discussed above. The example transceiver 1626 includes at least one receive path 1625 and at least one transmit path 1627. The receive path 1625 shown in FIG. 16 may correspond to the receive circuit 140 discussed above with reference to FIGS. 1 and 2.

Although only one RF front-end 1628, one transceiver 1626, and one communication processor 1624 are shown in FIG. 16, it is to be appreciated that the wireless device 1600 can include multiple instances of any or all such components. Also, although only certain components are explicitly depicted in FIG. 16 and are shown coupled together in a particular manner, the transceiver 1626 or the RF front-end 1628 may include other non-illustrated components (e.g., switches), more or fewer components, differently coupled arrangements of components, and so forth.

In some implementations, the RF front-end 1628 couples the antenna 110 to the transceiver 1626 via the signal propagation path 1622. In operation, the signal propagation path 1622 carries an RF signal between the antenna 110 and the transceiver 1626. During or as part of the signal propagation, the signal propagation path 1622 conditions the propagating RF signal, such as with the filter 120 and the LNA 130. This enables the RF front-end 1628 to couple the RF signal from the antenna 110 to the transceiver 1626 as part of a reception operation. The RF front-end 1628 also enables an RF signal to be coupled from the transceiver 1626 to the antenna 110 as part of a transmission operation to transmit the RF signal. Although not explicitly shown in FIG. 16, the RF front-end 1628 may include one or more other components, such as another filter, another amplifier (e.g., power amplifier for transmission), an N-plexer, a phase shifter, one or more switches, and so forth.

In some implementations, the receive path 1625 (e.g., receive circuit 140) may include an amplifier 1630 (e.g., an LNA), a filter 1634, a mixer 1608 for frequency downconversion, and an analog-to-digital converter (ADC) 1612. In the example in FIG. 16, the amplifier 1630, the filter 1634, the mixer 1608, and the ADC 1612 are coupled in a chain. The transmit path 1627 may include a power amplifier 1654, a filter 1656, a mixer 1658 for frequency upconversion, and a digital-to-analog converter (DAC) 1660. In the example in FIG. 16, the power amplifier 1654, the filter 1656, the mixer 1658, and the DAC 1660 are coupled in a chain. However, the receive path 1625 and the transmit path 1627 can include other components, such as, for example, additional amplifiers or filters, multiple mixers, and/or one or more buffers, which may be electrically disposed anywhere along the depicted receive path 1625 and transmit path 1627.

The transceiver 1626 may also include at least one phase-locked loop (PLL) 1632 that is coupled to the mixer 1608 and/or the mixer 1658. The PLL 1632 is configured to generate one or more local oscillator signals for frequency conversion. For example, the mixer 1608 may mix one of the local oscillator signals with a received RF signal to frequency downconvert the RF signal to a baseband signal or an IF signal. The transceiver 1626 can include one PLL 1632 for each transmit/receive path pair, one PLL 1632 per transmit path and one PLL 1632 per receive path, multiple PLLs 1632 per path, and so forth.

As shown for certain example implementations of the receive path 1625, the antenna 110 is coupled to the amplifier 1630 via the signal propagation path 1622 using the filter 120 and the LNA 130 thereof, and the amplifier 1630 is coupled to the filter 1634. The filter 1634 is coupled to the mixer 1608, and the mixer 1608 is coupled to the ADC 1612. The ADC 1612 is in turn coupled to the communication processor 1624. As shown for certain example implementations of the transmit path 1627, the communication processor 1624 is coupled to the DAC 1660, and the DAC 1660 is coupled to the mixer 1658. The mixer 1658 is coupled to the filter 1656, and the filter 1656 is coupled to the power amplifier 1654. The power amplifier 1654 is coupled to the antenna 110 via the signal propagation path 1622 using the filter 1620 thereof. Although only one receive path 1625 and one transmit path 1627 are explicitly shown, it is to be appreciated that the transceiver 1626 may include multiple instances of either or both components. Although the ADC 1612 and the DAC 1660 are illustrated as being separately coupled to the communication processor 1624, they may share a bus or other means for communicating with the communication processor 1624.

As part of an example signal-receiving operation, the amplifier 1630 provides an amplified signal to the filter 1634. The filter 1634 filters the amplified signal and provides a filtered signal to the mixer 1608. The mixer 1608 performs a frequency conversion operation on the filtered signal to downconvert from one frequency to a lower frequency (e.g., from a radio frequency (RF) to an intermediate frequency (IF) or to a baseband frequency (BBF)). The mixer 1608 can perform the frequency downconversion in a single conversion step or through multiple conversion steps using at least one PLL 1632. The mixer 1608 can provide a downconverted signal to the ADC 1612 for conversion to a digital signal (e.g., digital baseband signal), which is sent to the communication processor 1624.

As part of an example signal-transmitting operation, the mixer 1658 receives an analog signal at BBF or IF from the DAC 1660. The mixer 1658 upconverts the analog signal to a higher frequency, such as to an RF frequency, to produce an RF signal using a signal generated by the PLL 1632 to have a target synthesized frequency. The mixer 1658 provides the RF signal to the filter 1656, which filters the signal. After filtering by the filter 1656, the power amplifier 1654 amplifies the filtered signal to provide an amplified signal to the signal propagation path 1622 for signal conditioning. The RF front-end 1628 can use, for instance, the filter 1620 of the signal propagation path 1622 to provide a filtered signal to the antenna 110 for transmission.

FIG. 16 illustrates just some examples for a transceiver 1626 and/or an RF front-end 1628. The components illustrated in FIG. 16 may be manufactured or packaged in various manners. For example, one physical module may include components of the RF front-end 1628 and some components of the transceiver 1626, and another physical module may combine the communication processor 1624 with the remaining components of the transceiver 1626. Further, in some cases, the antenna 110 may be co-packaged with at least some components of the RF front-end 1628 and/or the transceiver 1626. Further, it is to be appreciated that the LNA 130 may be part of the transceiver 1626 in some implementations. For example, in some implementations, the amplifier 1630 may include the LNA 130 (e.g., for cases where there is no RF front-end 1628 or the RF front-end 1628 does not include the LNA 130). In general, the LNA 130 may be in the RF front-end 1628 or the transceiver 1626.

The wireless device 1600 may receive and transmit RF signal in one or more networks including a fourth generation (4G) network (e.g., such as a Long-Term Evolution (LTE) network), a fifth generation (5G) network which may be referred to as New Radio (NR) network, and/or another network. These networks may employ technologies such as code division multiple access (CDMA), time division multiple access (TDMA), frequency division multiple access (FDMA), orthogonal frequency division multiple access (OFDMA), or discrete Fourier transform-spread-OFDM (DFT-S-OFDM).

Figure 17:
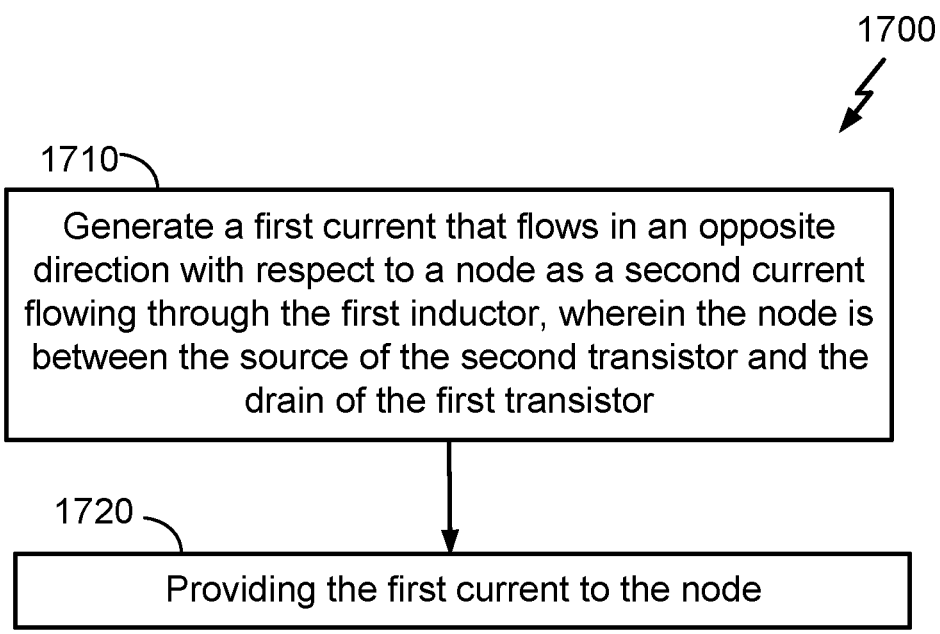
FIG. 17 is a flowchart illustrating a method of operating an amplifier according to certain aspects of the present disclosure.

FIG. 17 is a flowchart illustrating an example of a method 1700 for operating an amplifier. The amplifier includes a first transistor (e.g., the first transistor 410), a second transistor (e.g., the second transistor 420), and a first inductor (e.g., Ld). A gate of the first transistor is coupled to an input of the amplifier, the gate of the second transistor is biased by a bias voltage, a source of the second transistor is coupled to a drain of the first transistor, and the first inductor is coupled to a drain of the second transistor.

At block 1710, a first current that flows in an opposite direction with respect to a node as a second current flowing through the first inductor is generated, wherein the node is between the source of the second transistor and the drain of the second transistor. For example, the node may correspond to node X. In certain aspects, generating the first current includes inducing the first current in a second inductor (e.g., Lf), wherein the second inductor is coupled with the first inductor through negative magnetic coupling.

At block 1720, the first current is provided to the node. Because the first current flows in the opposite direction as the second current with respect to the node (e.g., node X), the first current at least partially cancels out the effect of the drain-to-source capacitance (e.g., Cds2) of the second transistor on the real part of the input impedance of the amplifier (e.g., to provide better impedance matching between the input of the amplifier and a filter coupled to the input of the amplifier).

In certain aspects, the second inductor and a capacitor (e.g., Cf) are coupled in series between the node and a supply rail (e.g., supply rail 430) or between the node and a ground.

Implementation examples are described in the following numbered clauses:

1. An apparatus, comprising:
   an amplifier, comprising:
   a first transistor having a gate, a source, and a drain, wherein the gate of the first transistor is coupled to an input of the amplifier, and the source of the first transistor is coupled to a ground;
   a second transistor having a gate, a source, and a drain, wherein the gate of the second transistor is configured to receive a bias voltage, and the source of the second transistor is coupled to the drain of the first transistor;
   a first inductor coupled between the drain of the second transistor and a supply rail; and
   a circuit coupled to a node, wherein the node is between the first transistor and the second transistor, and the circuit comprises:
   a second inductor, wherein the second inductor is coupled with the first inductor through negative magnetic coupling; and
   a capacitor coupled in series with the second inductor.

2. The apparatus of clause 1, wherein the circuit is coupled between the node and the supply rail.

3. The apparatus of clause 1, wherein the circuit is coupled between the node and the ground.

4. The apparatus of any one of clauses 1 to 3, further comprising a filter coupled to the input of the amplifier.

5. The apparatus of clause 4, wherein the filter comprises a bandpass filter.

6. The apparatus of any one of clauses 1 to 5, wherein the amplifier further comprises a third inductor magnetically coupled with the first inductor.

7. The apparatus of clause 6, wherein the third inductor is coupled between the ground and an output of the amplifier.

8. The apparatus of clause 7, further comprising a mixer coupled to the output of the amplifier.

9. The apparatus of any one of clauses 1 to 8, wherein the amplifier further comprises a source inductor coupled between the source of the first transistor and the ground.

10. The apparatus of any one of clauses 1 to 9, wherein the amplifier further comprises a gate inductor coupled between the gate of the first transistor and the input of the amplifier.

11. The apparatus of any one of clauses 1 to 10, wherein the capacitor comprises a variable capacitor.

12. The apparatus of clause 11, wherein the variable capacitor comprises multiple switching-capacitor circuits coupled in parallel, each of the switching-capacitor circuits comprising a respective capacitor and a respective switch coupled in series.

13. The apparatus of any one of clauses 1 to 5 and 9 to 12, wherein the first inductor is coupled to an output of the amplifier.

14. The apparatus of clause 13, further comprising a mixer coupled to the output of the amplifier.

15. The apparatus of any one of clauses 1 to 14, further comprising a radio frequency (RF) front-end module, wherein the RF front-end module includes:
   the amplifier; and
   a filter coupled to the input of the filter.

16. The apparatus of clause 15, wherein the filter comprises a bandpass filter.

17. The apparatus of clause 15 or 16, wherein the RF front-end module is coupled between an antenna and a receive circuit.

18. The apparatus of clause 17, wherein the receive circuit is integrated on a chip coupled to the RF front-end module.

19. The apparatus of any one of clauses 1 to 18, further comprising:
a second capacitor coupled to the first inductor; and
a resistor coupled to the first inductor.

20. The apparatus of clause 19, wherein the second capacitor is coupled in parallel with the first inductor.

21. The apparatus of clause 19 or 20, wherein the resistor is coupled in parallel with the first inductor.

22. An apparatus, comprising:
an amplifier, comprising:
a first transistor having a gate, a source, and a drain, wherein the gate of the first transistor is coupled to an input of the amplifier, and the source of the first transistor is coupled to a ground;
a second transistor having a gate, a source, and a drain, wherein the gate of the second transistor is configured to receive a bias voltage, and the source of the second transistor is coupled to the drain of the first transistor;
a first inductor and a second inductor coupled in series between the drain of the second transistor and a supply rail; and
a circuit coupled to a node, wherein the node is between the first transistor and the second transistor, and the circuit comprises:
a third inductor, wherein the third inductor is coupled with the first inductor through negative magnetic coupling; and
a capacitor coupled in series with the third inductor.

23. The apparatus of clause 22, wherein the circuit is coupled between the node and the supply rail.

24. The apparatus of clause 22, wherein the circuit is coupled between the node and the ground.

25. The apparatus of any one of clauses 22 to 24, wherein an output of the amplifier is coupled between the first inductor and the second inductor.

26. The apparatus of clause 25, further comprising a mixer coupled to the output of the amplifier.

27. The apparatus of any one of clauses 22 to 26, further comprising a filter coupled to the input of the amplifier.

28. The apparatus of clause 27, wherein the filter comprises a bandpass filter.

29. The apparatus of any one of clauses 22 to 28, wherein the amplifier further comprises a source inductor coupled between the source of the first transistor and the ground.

30. The apparatus of any one of clauses 22 to 29, wherein the amplifier further comprises a gate inductor coupled between the gate of the first transistor and the input of the amplifier.

31. The apparatus of any one of clauses 22 to 30, wherein the capacitor comprises a variable capacitor.

32. The apparatus of clause 31, wherein the variable capacitor comprises multiple switching-capacitor circuits coupled in parallel, each of the switching-capacitor circuits comprising a respective capacitor and a respective switch coupled in series.

33. The apparatus of any one of clauses 22 to 32, wherein the third inductor is coupled with the second inductor through negative magnetic coupling.

34. A method of operating an amplifier, the amplifier including a first transistor, a second transistor, and a first inductor, wherein a gate of the first transistor is coupled to an input of the amplifier, the gate of the second transistor is biased by a bias voltage, a source of the second transistor is coupled to a drain of the first transistor, and the first inductor is coupled to a drain of the second transistor, the method comprising:
generating a first current that flows in an opposite direction with respect to a node as a second current flowing through the first inductor, wherein the node is between the source of the second transistor and the drain of the second transistor; and
providing the first current to the node.

35. The method of clause 34, wherein generating the first current comprises inducing the first current in a second inductor, wherein the second inductor is coupled with the first inductor through negative magnetic coupling.

36. The method of clause 35, wherein the second inductor and a capacitor are coupled in series between the node and a supply rail or between the node and a ground.

37. The method of any one of clauses 34 to 36, wherein a filter is coupled to the input of the amplifier.

38. An apparatus, comprising:
an amplifier, comprising:
a transconductance device coupled to an input of the amplifier;
a current buffer coupled to the transconductance device;
a first inductor coupled between the current buffer and a supply rail; and
a circuit coupled to a node, wherein the node is between the transconductance device and the current buffer, and the circuit comprises:
a second inductor, wherein the second inductor is coupled with the first inductor through negative magnetic coupling, and
a capacitor coupled in series with the second inductor.

39. The apparatus of clause 38, wherein the circuit is coupled between the node and the supply rail.

40. The apparatus of clause 38, wherein the circuit is coupled between the node and a ground.

41. The apparatus of any one of clauses 38 to 40, further comprising a filter coupled to the input of the amplifier.

42. The apparatus of clause 41, wherein the filter comprises a bandpass filter.

43. The apparatus of any of clauses 38 to 42, wherein the amplifier further comprises a third inductor magnetically coupled with the first inductor.

44. The apparatus of clause 43, wherein the third inductor is coupled to an output of the amplifier.

45. The apparatus of clause 44, further comprising a mixer coupled to the output of the amplifier.

46. The apparatus of any one of clauses 38 to 42, wherein the first inductor is coupled to an output of the amplifier.

47. The apparatus of clause 46, further comprising a mixer coupled to the output of the amplifier.

The communication processor 1624 discussed above may be implemented with a general-purpose processor, a digital signal processor (DSP), a state machine, an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computerreadable storage medium, such as a RAM, a ROM, an EEPROM, an optical disk, and/or a magnetic disk.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. It is also to be appreciated that the term "ground" may refer to a direct current (DC) ground or an alternating current (AC) ground, and thus the term "ground" covers both possibilities. An AC ground may be provided by a DC voltage.

It is also to be appreciated that the load inductor Ld, the first load inductor Ld1, the second load inductor Ld2, and the inductor Lf discussed above according to various aspects may also be distinguished from one another using numerical designations. For example, in the examples shown in FIGS. 8 and 12, load inductor Ld may be designated as a first inductor and the inductor Lf may be designated as a second inductor. In the examples shown in FIGS. 5, 6, 9, 11, 13, and 14 the first load inductor Ld1 may be designated as a first inductor, the second load inductor Ld2 may be designated as a second inductor, and the inductor Lf may be designated as a third inductor. In general, it is to be understood that the load inductor Ld, the first load inductor Ld1, the second load inductor Ld2, and the inductor Lf discussed above may be designated using any combination of numerical designations for distinguishing between these inductors.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
an amplifier, comprising:
a first transistor having a gate, a source, and a drain, wherein the gate of the first transistor is coupled to an input of the amplifier, and the source of the first transistor is coupled to a ground;
a second transistor having a gate, a source, and a drain, wherein the gate of the second transistor is configured to receive a bias voltage, and the source of the second transistor is coupled to the drain of the first transistor;
a first inductor coupled between the drain of the second transistor and a supply rail; and
a circuit coupled to a node, wherein the node is between the first transistor and the second transistor, and the circuit comprises:
a second inductor, wherein the second inductor is coupled with the first inductor through negative magnetic coupling; and
a capacitor coupled in series with the second inductor.

2. The apparatus of claim 1, wherein the circuit is coupled between the node and the supply rail.

3. The apparatus of claim 1, wherein the circuit is coupled between the node and the ground.

4. The apparatus of claim 1, further comprising a filter coupled to the input of the amplifier.

5. The apparatus of claim 4, wherein the filter comprises a bandpass filter.

6. The apparatus of claim 1, wherein the amplifier further comprises a third inductor magnetically coupled with the first inductor.

7. The apparatus of claim 6, wherein the third inductor is coupled to an output of the amplifier.

8. The apparatus of claim 7, further comprising a mixer coupled to the output of the amplifier.

9. The apparatus of claim 1, wherein the amplifier further comprises a source inductor coupled between the source of the first transistor and the ground.

10. The apparatus of claim 1, wherein the amplifier further comprises a gate inductor coupled between the gate of the first transistor and the input of the amplifier.

11. The apparatus of claim 1, wherein the capacitor comprises a variable capacitor.

12. The apparatus of claim 11, wherein the variable capacitor comprises multiple switching-capacitor circuits coupled in parallel, each of the switching-capacitor circuits comprising a respective capacitor and a respective switch coupled in series.

13. The apparatus of claim 1, wherein the first inductor is coupled to an output of the amplifier.

14. The apparatus of claim 13, further comprising a mixer coupled to the output of the amplifier.

15. The apparatus of claim 1, further comprising a radio frequency (RF) front-end module, wherein the RF front-end module includes:
the amplifier; and
a filter coupled to the input of the filter.

16. The apparatus of claim 15, wherein the filter comprises a bandpass filter.

17. The apparatus of claim 15, wherein the RF front-end module is coupled between an antenna and a receive circuit.

18. The apparatus of claim 17, wherein the receive circuit is integrated on a chip coupled to the RF front-end module.

19. The apparatus of claim 1, further comprising:
a second capacitor coupled to the first inductor; and
a resistor coupled to the first inductor.

20. The apparatus of claim 19, wherein the second capacitor is coupled in parallel with the first inductor.

21. The apparatus of claim 19, wherein the resistor is coupled in parallel with the first inductor.

* * * * *